(12) United States Patent
Lee et al.

(10) Patent No.: US 11,962,295 B2
(45) Date of Patent: Apr. 16, 2024

(54) MULTIPLEXER AND SEMICONDUCTOR DEVICE INCLUDING THE SAME

(71) Applicant: SAMSUNG ELECTRONICS CO., LTD., Suwon-si (KR)

(72) Inventors: Sangheon Lee, Seoul (KR); Woongtaek Lim, Seoul (KR); Jungho Lee, Anyang-si (KR); Youngjae Cho, Hwaseong-si (KR); Michael Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 232 days.

(21) Appl. No.: 17/387,221

(22) Filed: Jul. 28, 2021

(65) Prior Publication Data

US 2022/0166429 A1 May 26, 2022

(30) Foreign Application Priority Data

Nov. 23, 2020 (KR) .................. 10-2020-0157648

(51) Int. Cl.
*H03M 1/00* (2006.01)
*H02M 3/07* (2006.01)
(Continued)

(52) U.S. Cl.
CPC ............ *H03K 17/693* (2013.01); *H02M 3/07* (2013.01); *H03M 1/122* (2013.01)

(58) Field of Classification Search
CPC .... H03M 1/1245; H03M 1/1215; H03M 1/08; H03M 1/001; H03M 1/002; H03M 1/0607; H03M 1/0629; H03M 1/0845; H03M 1/1061; H03M 1/12; H03M 1/183; H03M 1/468; H03M 1/54; H03M 3/496;
(Continued)

(56) References Cited

U.S. PATENT DOCUMENTS 5,943,226 A 8/1999 Kim
8,466,818 B1 6/2013 Johancsik et al.
(Continued)

FOREIGN PATENT DOCUMENTS

JP 5372645 12/2013
KR 10-0351986 9/2002

OTHER PUBLICATIONS

Wen-Ming Zheng, et al., "Capacitive Floating Level Shifter: Modeling and Design", 2015, IEEE.

*Primary Examiner* — Linh V Nguyen
(74) *Attorney, Agent, or Firm* — F. Chau & Associates, LLC

(57) ABSTRACT

A multiplexer includes a charging circuit; a plurality of sampling switches receiving a plurality of input signals; and a plurality of boosting circuits connected between the sampling switches and the charging circuit and sharing the charging circuit. First and second charging switches of the charging circuit are controlled by a first clock signal. Each of the boosting circuits includes a first boosting switch connected to a first node of the charging circuit and a gate of one of the sampling switches, a second boosting switch connected between a second node of the charging circuit and the one sampling switch, and a level shifter configured to control the first boosting switch and the second boosting switch in response to a second clock signal and a selection signal.

17 Claims, 17 Drawing Sheets

(51) Int. Cl.
 *H03K 17/693* (2006.01)
 *H03M 1/12* (2006.01)
(58) Field of Classification Search
 CPC ............... H03K 17/063; H03K 17/693; H03K 17/6257; H03K 2217/0036; H03K 2217/0081; H03K 17/04206; H03K 17/08122; H03K 17/08142; H03K 17/145; H03K 17/16; H03K 17/223; H03K 19/017; H03K 17/6871; H03K 19/018521
 USPC .......................... 341/122, 143, 141, 142, 172
 See application file for complete search history.

(56) References Cited

U.S. PATENT DOCUMENTS

| | | | |
|---|---|---|---|
| 8,542,143 B1 | 9/2013 | Haque et al. | |
| 8,854,085 B1* | 10/2014 | Francis | H03M 1/1245 327/91 |
| 9,401,727 B1* | 7/2016 | Mastantuono | G11C 27/024 |
| 9,407,478 B1* | 8/2016 | Mastantuono | H03D 7/1441 |
| 9,419,509 B2 | 8/2016 | Jarvinen et al. | |
| 9,419,639 B1* | 8/2016 | Hu | G11C 27/024 |
| 9,484,905 B1* | 11/2016 | Mai | H03K 17/08122 |
| 2012/0218133 A1* | 8/2012 | Thirunakkarasu | H03K 17/693 327/408 |
| 2015/0188533 A1* | 7/2015 | Viswanath | H05G 1/70 327/390 |
| 2017/0331488 A1* | 11/2017 | Lee | G11C 27/024 |
| 2019/0207617 A1* | 7/2019 | Xavier | H03M 1/1245 |
| 2021/0091766 A1* | 3/2021 | Huang | H03K 17/223 |
| 2021/0091778 A1* | 3/2021 | Shrivastava | G06F 1/263 |
| 2021/0258016 A1* | 8/2021 | Jalili Sebardan | H03F 3/70 |

* cited by examiner

MULTIPLEXER AND SEMICONDUCTOR DEVICE INCLUDING THE SAME

CROSS TO REFERENCE TO RELATED APPLICATION(S)

This U.S. non-provisional patent application claims benefit of priority under 35 U.S.C. 119(a) to Korean Patent Application No. 10-2020-0157648 filed on Nov. 23, 2020 in the Korean Intellectual Property Office, the disclosure of which is incorporated by reference in its entirety herein.

BACKGROUND

1. Technical Field

Example embodiments of the present disclosure relate to a multiplexer and a semiconductor device including the same.

2. Discussion of Related Art

A semiconductor device included in an electronic device may include an analog-to-digital converter for converting an analog signal into a digital signal. An input terminal of the analog-to-digital converter may be connected to a plurality of analog circuits performing different functions. A multiplexer may be present to select one of the plurality of analog circuits and to transfer the analog signal to the analog-to-digital converter. A bootstrap circuit may be included in the multiplexer to reduce power consumption and to secure linearity of an input signal. However, use of the bootstrap circuit increases a circuit area of the multiplexer.

SUMMARY

An example embodiment of the present disclosure may provide a multiplexer with a reduced area and increased reliability that operates with a low driving voltage and secures linearity, and a semiconductor device including the same.

According to an example embodiment of the present disclosure, a multiplexer includes a charging circuit, a plurality of sampling switches, and a plurality of boosting circuits. The charging circuit includes a first charging switch connected to a first power node for outputting a first power voltage, a second charging switch connected to a second power node for outputting a second power voltage lower than the first power voltage, and a capacitor connected between a first node connected to the first charging switch and a second node connected to the second charging switch. The plurality of sampling switches are configured to receive a plurality of input signals. The plurality of boosting circuits are connected between the plurality of sampling switches and the charging circuit and configured to share the charging circuit. The first charging switch and the second charging switch are controlled by a first clock signal. Each of the plurality of boosting circuits includes a first boosting switch connected to the first node and a gate one of the plurality of sampling switches, a second boosting switch connected between the second node and the one of the plurality of sampling switches, and a level shifter configured to control the first boosting switch and the second boosting switch in response to a second clock signal and a selection signal.

According to an example embodiment of the present disclosure, a multiplexer includes a charging circuit, a plurality of sampling switches, and a plurality of boosting circuits. The charging circuit includes a capacitor charged in response to a first clock signal. The plurality of sampling switches are configured to receive a plurality of input signals. The plurality of boosting circuits are connected between the plurality of sampling switches and the charging circuit, and are configured to share the charging circuit and operate in response to a second clock signal having a phase opposite to the first clock signal. When a selected sampling switch and non-selected sampling switches are determined among the plurality of sampling switches, a selected boosting circuit among the plurality of boosting circuits, connected to the selected sampling switch, is electrically connected to the charging circuit, and non-selected boosting circuits among the plurality of boosting circuits, connected to the non-selected sampling switches are electrically disconnected from the charging circuit.

According to an example embodiment of the present disclosure, a semiconductor device includes an analog-to-digital converter, a multiplexer, and a plurality of analog circuits. The analog-to-digital converter is configured to convert an analog input signal into a digital output signal. The multiplexer is connected to an input terminal of the analog-to-digital converter and is configured to select one of a plurality of analog signals as the analog input signal. The plurality of analog circuits are configured to output the plurality of analog signals. The multiplexer includes a charging circuit including a capacitor, a plurality of sampling switches, and a plurality of boosting circuits connected between the charging circuit and the plurality of sampling switches. Each of the plurality of sampling switches is connected between an output terminal of one of the plurality of analog circuits and an input terminal of the analog-digital converter. Each of the plurality of boosting circuits includes a first boosting switch connected between an upper node of the capacitor and a gate of one of the plurality of sampling switches, a second boosting switch connected between a lower node of the capacitor and a source of the one of the plurality of sampling switches, and a level shifter configured to control the first boosting switch and the second boosting switch.

BRIEF DESCRIPTION OF DRAWINGS

The present disclosure will be more clearly understood from the following detailed description, taken in conjunction with the accompanying drawings, in which.

DETAILED DESCRIPTION OF THE EMBODIMENTS

Hereinafter, embodiments of the present disclosure will be described as follows with reference to the accompanying drawings.

Figure 1:
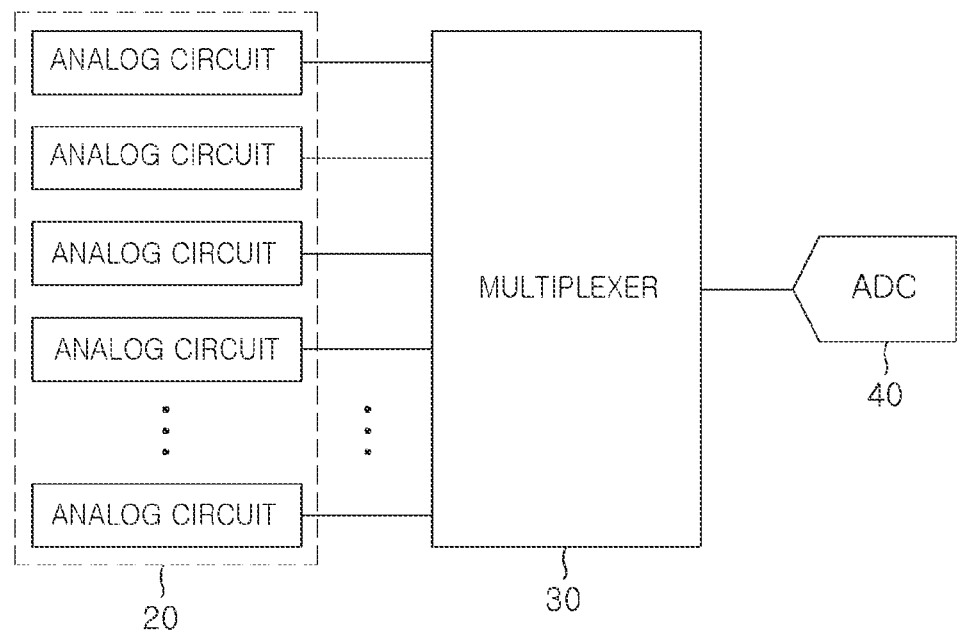
FIG. 1 is a diagram illustrating a semiconductor device according to an example embodiment of the present disclosure.

FIG. 1 is a diagram illustrating a semiconductor device according to an example embodiment.

Referring to FIG. 1, a semiconductor device 10 in an example embodiment includes a plurality of analog circuits 20, a multiplexer 30, and an analog-to-digital converter 40. The multiplexer 30 selects one of the plurality of analog circuits 20. An analog signal output by the analog circuit selected by the multiplexer 30 is input to the analog-to-digital converter 40 as an analog input signal. The analog-to-digital converter 40 converts the analog input signal into a digital output signal, and the digital output signal may be input to a digital signal processor (DSP) as an example.

At least a portion of the plurality of analog circuits 20 may perform different functions. For example, the plurality of analog circuits 20 may include a reception circuit including a mixer, a filter, or an amplifier, which may process an analog signal received from an external entity through an antenna. Also, the plurality of analog circuits 20 may include a capacitance detection circuit configured to detect a change in capacitance occurring in a touchscreen and to convert the change into an analog signal. In an example embodiment, the plurality of analog circuits 20 include a pixel compensation circuit connected to pixels of a display device and for detecting a change in threshold voltage of an organic light emitting diode and/or a transistor included in the pixels.

The multiplexer 30 may include a plurality of sampling switches, an input terminal of each of the plurality of sampling switches may be connected to one among the plurality of analog circuits 20, and an output terminal of the plurality of sampling switches may be connected to an input terminal of the analog-to-digital converter 40 in common. The multiplexer 30 may turn on one of the plurality of sampling switches in response to a selection signal. Accordingly, an analog signal output by a circuit selected from among the plurality of analog circuits 20 may be input to the analog-digital converter 40 as an analog input signal.

Each of the plurality of sampling switches included in the multiplexer 30 may be implemented as a transistor, and may be represented as a resistor having a predetermined on-resistance value in a turned-on state. As a power voltage of the semiconductor device 10 including the analog-to-digital converter 40 decreases to reduce power consumption, an effect of the on-resistance value of the sampling switch in the turned-on state on an operation of the analog-to-digital converter 40 may increase. Fluctuations in the on-resistance value of the sampling switch in the turned-on state may be reduced and performance of the analog-to-digital converter 40 may be improved by connecting a bootstrap circuit to the plurality of sampling switches.

In an example embodiment, the bootstrap circuit includes a capacitor. Accordingly, when each of the plurality of sampling switches included in the multiplexer 30 is connected to the bootstrap circuit, capacitors corresponding to the number of the plurality of analog circuits 20 connected to the multiplexer 30 may be added. For example, when n (e.g., a non-negative integer greater than 0) number of analog circuits 20 are connected to the multiplexer 30, the multiplexer 30 may include n number of bootstrap circuits connected to n number of sampling switches, which is a factor that greatly increases a circuit area. Also, since one of the n number of sampling switches included in the multiplexer 30 is selected, n−1 number of bootstrap circuits and n−1 number of capacitors connected to n−1 number of non-selected sampling switches occupy portions of the circuit area.

In an example embodiment, the above issue is addressed by configuring the plurality of sampling switches included in the multiplexer 30 to share a single capacitor. For example, the plurality of sampling switches may share a charging circuit including a capacitor and charging switches for charging the capacitor in the bootstrap circuit. Each of the plurality of sampling switches may be individually connected to the boosting circuit. Accordingly, the plurality of boosting circuits share a single charging circuit, and the number of capacitors required to implement the bootstrap circuit in the multiplexer 30 is reduced, thereby reducing the circuit area occupied by the multiplexer 30.

Figure 2:
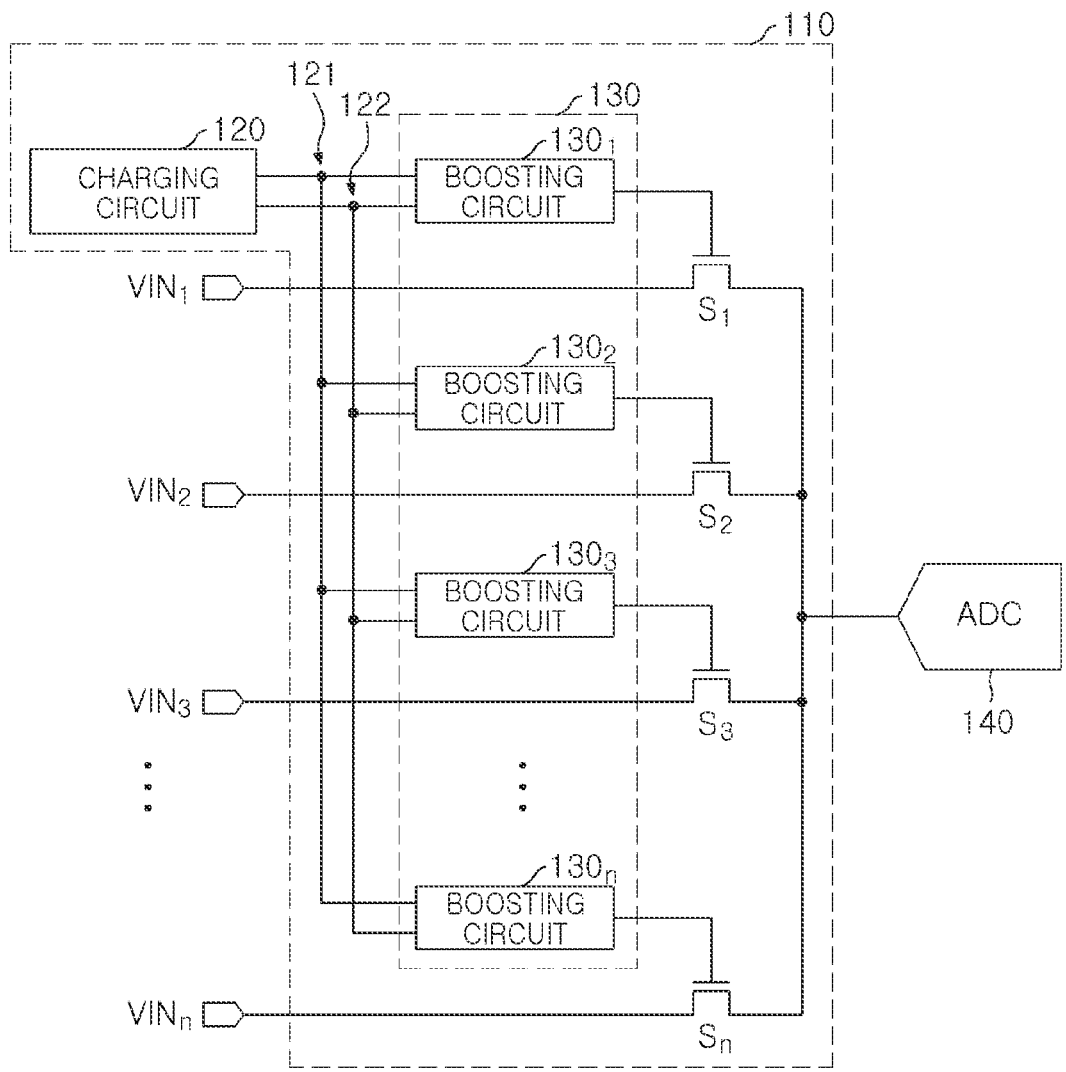
FIGS. 2 and 3 are diagrams illustrating a semiconductor device according to an example embodiment of the present disclosure.
Figure 3:
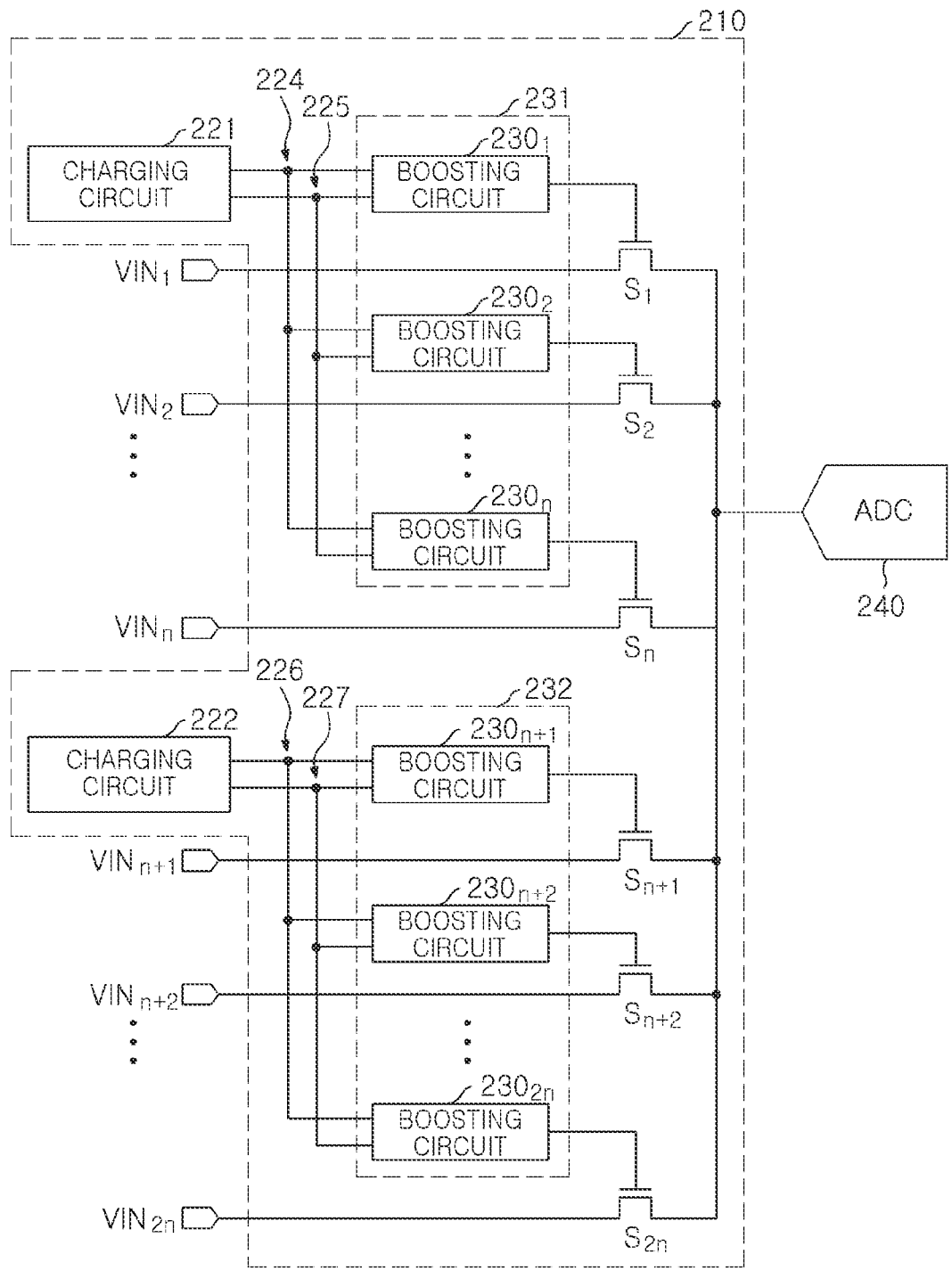

FIGS. 2 and 3 are diagrams illustrating a semiconductor device according to an example embodiment.

Referring to FIG. 2, a semiconductor device 100 in an example embodiment includes a multiplexer 110 and an analog-to-digital converter 140. The multiplexer 110 includes a charging circuit 120, a plurality of boosting circuits $130_1$-$130_n$ (130), and a plurality of sampling switches $S_1$-$S_n$. The number of the plurality of boosting circuits 130 and the plurality of sampling switches $S_1$-$S_n$ may be varied in example embodiments. The multiplexer 30 may be implemented using the multiplexer 110.

The plurality of sampling switches $S_1$-$S_n$ may transmit one of the plurality of analog signals $VIN_1$-$VIN_n$ to the analog-digital converter 140 as an analog input signal. The plurality of analog signals $VIN_1$-$VIN_n$ may be signals generated and output by various analog circuits. For example, at least a portion of the plurality of analog signals $VIN_1$-$VIN_n$ may be output by analog circuits performing different functions.

As illustrated in FIG. 2, in an example embodiment, a plurality of boosting circuits 130 share a single charging circuit 120. The charging circuit 120 may include a capacitor and charging switches for charging the capacitor. For example, a pair of electrodes included in the capacitor may be connected to the first node 121 and the second node 122. The plurality of boosting circuits 130 are connected to the first node 121 and the second node 122 in common as illustrated in FIG. 2. Each of the plurality of boosting circuits 130 may operate as a bootstrap circuit along with the charging circuit 120.

The plurality of boosting circuits 130 may control the plurality of sampling switches $S_1$-$S_n$. Outputs of the plurality of boosting circuits 130 may be input to gates of the plurality of sampling switches $S_1$-$S_n$. The plurality of boosting circuits 130 may operate in response to selection signals input from an external entity, may turn on a selected sampling switch among the plurality of sampling switches $S_1$-$S_n$, and may turn off the non-selected sampling switches.

Among the first node 121 and the second node 122 connecting the charging circuit 120 to the plurality of boosting circuits 130, the second node 122 may be connected to a signal path through which the plurality of analog signals $VIN_1$-$VIN_n$ are transmitted. In other words, the second node 122 may be connected to a node receiving one of the plurality of analog signals $VIN_1$-$VIN_n$ from each of the plurality of sampling switches $S_{11}$-$S_n$. For example, when the capacitor of the charging circuit 120 is charged, a voltage of the second node 122 may be lower than a voltage of the first node 121.

In an example embodiment, the charging circuit 120 operates in response to a first clock signal, and each of the plurality of boosting circuits 130 operate in response to one of the selection signals and a second clock signal. The second clock signal may have a phase opposite to that of the first clock signal. As an example, the operation of the multiplexer 110 may be divided into a pre-charge period in which the capacitor of the charging circuit 120 is charged by a first clock signal, and a boosting period in which the plurality of boosting circuits 130 turn on one of the plurality of sampling switches $S_1$-$S_n$ by a second clock signal and one of the plurality of analog signals $VIN_1$-$VIN_n$ is output to the analog-digital converter 140.

Referring to FIG. 3, a semiconductor device 200 in an example embodiment includes a multiplexer 210 and an analog-to-digital converter 240. The multiplexer 210 selects one of a plurality of analog signals $VIN_1$-$VIN_{2n}$ and inputs the selected signal to the analog-to-digital converter 240. The multiplexer 210 includes a first charging circuit 221, a second charging circuit 222, and a plurality of boosting circuits $230_1$-$230_{2n}$. The plurality of boosting circuits $230_1$-$230_{2n}$ may be divided into a first group 231 and a second group 232. The multiplexers 30 or 110 may be implemented by multiplexer 210.

In the example embodiment illustrated in FIG. 3, the boosting circuits $230_1$-$230_n$ included in the first group 231 share a first charging circuit 221. Similarly to the aforementioned example embodiment described with reference to FIG. 2, electrodes of the capacitor included in the first charging circuit 221 may be connected to the boosting circuits $230_1$-$230_n$ of the first group 231 through a first node 224 and a second node 225. Similarly, boosting circuits $230_1$-$230_{2n}$ included in the second group 232 may be connected to a second charging circuit 222 through a first node 226 and a second node 227.

In the example embodiment illustrated in FIG. 3, the number of boosting circuits $230_1$-$230_n$ included in the first group 231 is the same as the number of the boosting circuits $230_1$-$230_{2n}$ included in the second group 232. However, embodiments of the inventive concept are not limited thereto. For example, the number of boosting circuits included in the first group 231 and the second group 232 may be different in example embodiments.

Figure 4:
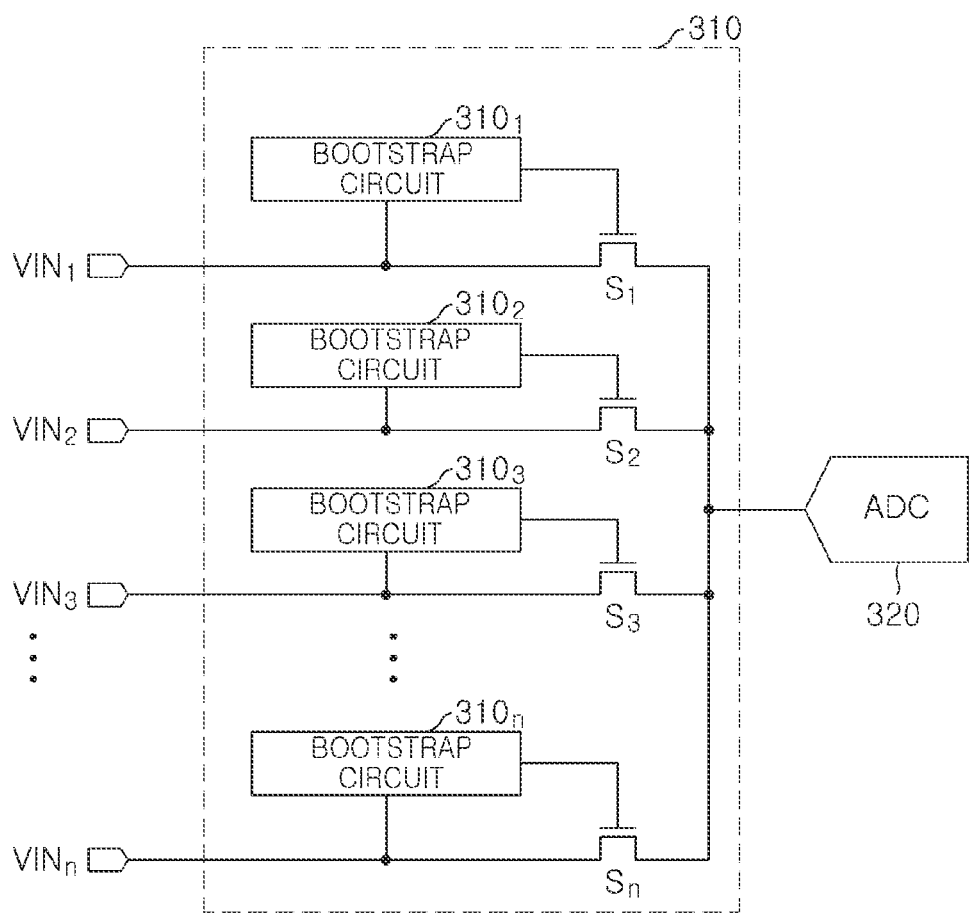
FIG. 4 is a diagram illustrating a comparative example of a semiconductor device according to an example embodiment of the present disclosure.

FIG. 4 is a diagram illustrating a comparative example of a semiconductor device according to an example embodiment.

FIG. 4 is a diagram illustrating a semiconductor device 300 according to a comparative example. Referring to FIG. 4, the semiconductor device 300 includes a multiplexer 310 and an analog-to-digital converter 320. The multiplexer 310 selects one of a plurality of analog signals $VIN_1$-$VIN_n$ and inputs the selected signal to the analog-to-digital converter 320. The multiplexers 30, 110, or 210 may be implemented by multiplexer 310.

In the comparative example, the multiplexer 310 includes a plurality of sampling switches $S_1$-$S_n$ and a plurality of bootstrap circuits $310_1$-$310_n$. Each of the plurality of bootstrap circuits $310_1$-$310_n$ may include a capacitor charged to a predetermined power voltage. While the multiplexer 310 operates, non-selected bootstrap circuits connected to non-selected sampling switches among the plurality of sampling switches $S_1$-$S_n$ do not operate.

Accordingly, the multiplexer 310 may include n number of capacitors occupying a relatively large area, whereas, in actual operation, only a single capacitor other than n−1 number of capacitors operate, which may be wasteful in terms of circuit configuration. In an example embodiment, the capacitors included in each of the plurality of bootstrap circuits $310_1$-$310_n$ are divided to form a charging circuit, and the charging circuit are shared by the plurality of boosting circuits, thereby reducing a circuit area occupied by the multiplexer 310.

Figure 5:
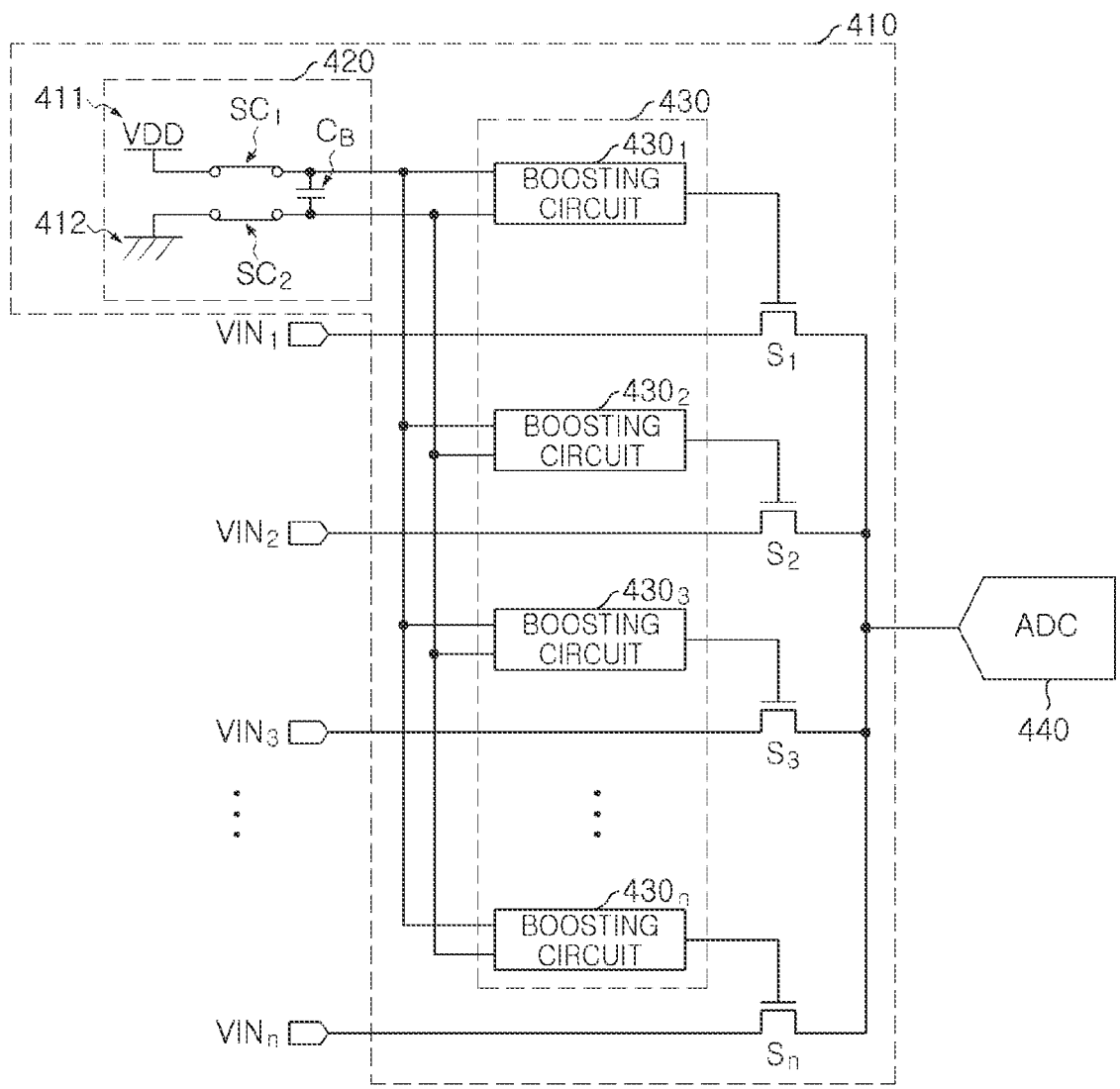
FIGS. 5 and 6 are diagrams illustrating an operation of a charging circuit in a multiplexer according to an example embodiment of the present disclosure.
Figure 6:
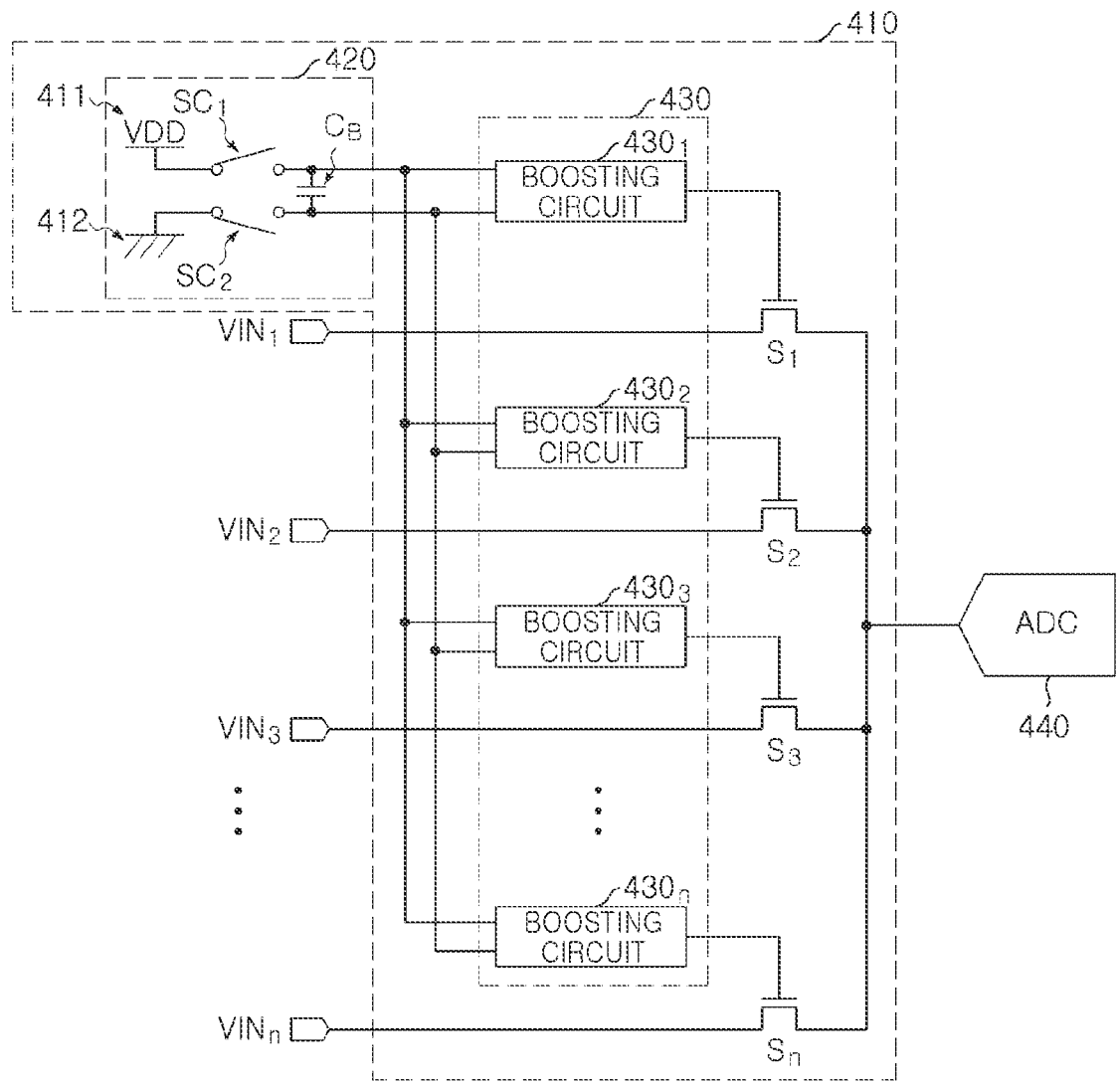

FIGS. 5 and 6 are diagrams illustrating an operation of a charging circuit in a multiplexer according to an example embodiment.

Referring to FIGS. 5 and 6, a semiconductor device 400 in an example embodiment includes a multiplexer 410 and an analog-digital converter 440. The multiplexer 410 includes a charging circuit 420 and a plurality of boosting circuits $430_1$-$430_n$ (430). The plurality of boosting circuits 430 share the charging circuit 420, and a connection structure between the charging circuit 420 and the plurality of boosting circuits 430 may be understood with reference to the example embodiment described with reference to FIG. 2. The multiplexers 30, 110, 210, or 310 may be implemented by multiplexer 410.

In the example embodiment illustrated in FIGS. 5 and 6, the charging circuit 420 includes a capacitor $C_B$, a first charging switch $SC_1$, and a second charging switch $SC_2$. The first charging switch $SC_1$ is connected between a first power node 411 supplying a first power voltage VDD and a capacitor $C_B$. The second charging switch $SC_2$ is connected between a second power node 412 supplying a second power voltage GND and the capacitor $C_B$. In an embodiment, the first power voltage VDD is higher than the second power voltage GND.

The first charging switch $SC_1$ and the second charging switch $SC_2$ may operate by a first clock signal. For example, each of the first charging switch $SC_1$ and the second charging switch $SC_2$ may be implemented as a transistor, and the first clock signal may be input to a gate of each of the first charging switch $SC_1$ and the second charging switch $SC_2$. In an embodiment, one of the first charging switch $SC_1$ and the second charging switch $SC_2$ is implemented as a negative-metal-oxide semiconductor (NMOS) transistor, and the other is implemented as a positive-metal-oxide semiconductor (PMOS) transistor.

As illustrated in FIG. 5, when the first charging switch $SC_1$ and the second charging switch $SC_2$ are turned on by the first clock signal, the capacitor $C_B$ is charged by a difference between a first power voltage VDD and a second power voltage GND. While the first charging switch $SC_1$ and the second charging switch $SC_2$ are turned on by the first clock signal, the plurality of boosting circuits 430 disconnect the plurality of sampling switches $S_1$-$S_n$ from the charging circuit 420 and maintain the sampling switches $S_1$-$S_n$ in a turned-off state. The time in which the first charging switch $SC_1$ and the second charging switch $SC_2$ are turned on may be defined as a pre-charge period.

As illustrated in FIG. 6, when the first charging switch $SC_1$ and the second charging switch $SC_2$ are turned off by the first clock signal, the plurality of boosting circuits 430 operate by a voltage charged to the capacitor $C_B$. The time during which the first charging switch $SC_1$ and the second charging switch $SC_2$ are turned off may be defined as a boosting period. In the boosting period, one of the plurality of sampling switches $S_1$-$S_n$ is selected as a selected sampling switch, and the rest are selected as non-selected sampling switches. For example, a selected sampling switch and non-selected sampling switches may be determined from among the plurality of sampling switches $S_1$-$S_n$ using selection signals generated by a processor unit included in the semiconductor device 400 along with the multiplexer 410.

In an example embodiment, the selection signals for determining the selected sampling switch and the non-selected sampling switches are input to a plurality of boosting circuits 430. Among the plurality of boosting circuits 430, a selected boosting circuit connected to the selected sampling switch is electrically connected to the charging circuit 420, and turns on the selected sampling switch using the voltage charged in the capacitor $C_B$. The non-selected boosting circuits connected to the non-selected sampling switches are electrically disconnected from the charging circuit 420 and turn off the non-selected sampling switches. In the boosting period, selection signals input to the selected boosting circuit and the non-selected boosting circuits may be different.

Figure 7:
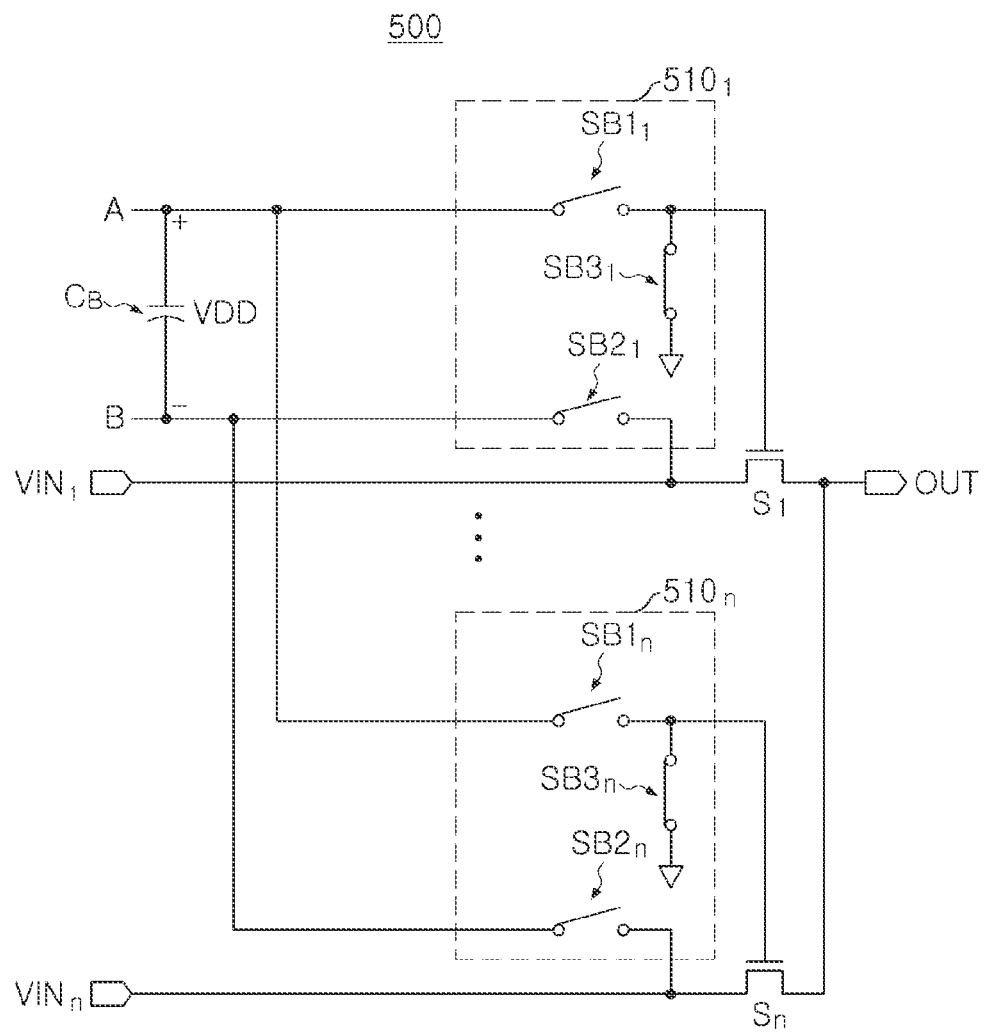
FIGS. 7 and 8 are diagrams illustrating an operation of a boosting circuit in a multiplexer according to an example embodiment of the present disclosure.
Figure 8:
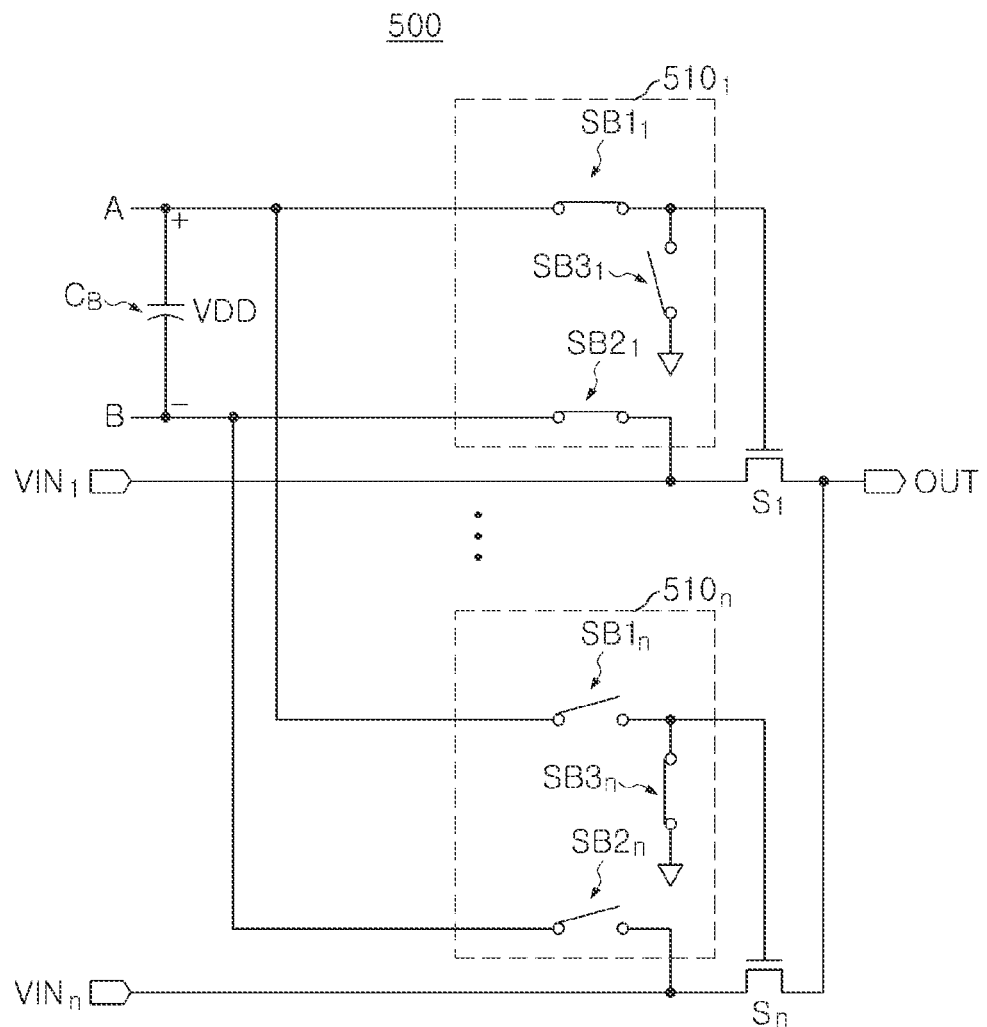

FIGS. 7 and 8 are diagrams illustrating an operation of a boosting circuit in a multiplexer according to an example embodiment.

Referring to FIGS. 7 and 8, a multiplexer 500 includes a plurality of boosting circuits $510_1$-$510_n$, (510), and the plurality of boosting circuits 510 share a single capacitor $C_B$. The capacitor $C_B$ may be included in a charging circuit of the multiplexer 500 and may be connected between a first node A and a second node B. The first node A may be supplied with a first power voltage through a first charging switch, and the second node B may be supplied with a second power voltage through a second charging switch. The capacitor $C_B$ may be charged with a predetermined voltage VDD by operation of the first charging switch and the second charging switch. The multiplexers 30, 110, 210, 310, or 410 may be implemented by multiplexer 500.

Each of the plurality of boosting circuits 510 may include a plurality of switches. For example, each of the plurality of boosting circuits 510 may include a first boosting switch SB1, a second boosting switch SB2, and a third boosting switch SB3. For example, in the first boosting circuit $510_1$, the first boosting switch $SB1_1$ is connected between a first node A and a gate of the first sampling switch S1. The second boosting switch $SB2_1$ is connected between a second node B and the first sampling switch S1. The third boosting switch $SB3_1$ is connected to a node between the gate of the first sampling switch S1 and the first boosting switch $SB1_1$.

FIG. 7 is a diagram illustrating an operation of the plurality of boosting circuits 510 in a pre-charge period during which the capacitor $C_B$ is charged. Referring to FIG. 7, in each of the plurality of boosting circuits 510 during the pre-charge period, the first boosting switch SB1 and the second boosting switch SB2 are turned off, and the third boosting switch SB3 is turned on. Since the third boosting switch SB3 is turned on and a voltage lower than a threshold voltage is input to a gate of each of the plurality of sampling switches $S_1$-$S_n$, the plurality of sampling switches $S_1$-$S_n$ are turned off. For example, the third boosting switch SB3 is connected to a voltage lower than the threshold of a transistor used to implement a sampling switch (e.g., $S_1$) during the pre-charge period. As described in the aforementioned example embodiment with reference to FIG. 5, the capacitor $C_B$ may be charged to a predetermined voltage VDD during the pre-charge period.

FIG. 8 is a diagram illustrating an operation of the plurality of boosting circuits 510 during a boosting period after the capacitor $C_B$ is charged. During the boosting period, one of the plurality of sampling switches $S_1$-$S_n$ is turned on by the plurality of boosting circuits 510 and the other sampling switches are turned off. In the example embodiment illustrated in FIG. 8, the first sampling switch $S_1$ is turned on by the first boosting circuit $510_1$. In this case, the other sampling switches are turned off.

Referring to FIG. 8, during the boosting period, the first boosting switch $SB1_1$ and the second boosting switch $SB2_1$ are turned on (e.g., closed) in the first boosting circuit $510_1$, and the third boosting switch $SB3_1$ is turned off (e.g., opened). Accordingly, the voltage VDD charged in the capacitor $C_B$ is input to a gate of the first sampling switch S1, the first sampling switch $S_1$ is turned on, and a first analog signal $VIN_1$ is output through an output terminal OUT. When the second boosting switch $SB2_1$ is turned on, an input terminal of the second boosting switch $SB2_1$ for receiving the first analog signal $VIN_1$ may be connected to the second node B. The output terminal OUT may be connected to an input terminal of an analog-to-digital converter. The other sampling switches may be turned off as described in the aforementioned example embodiment with reference to FIG. 7.

A terminal receiving one of the analog signals $VIN_1$-$VIN_n$ from each of the sampling switches $S_1$-$S_n$ may be connected to the second boosting switch SB2 and the second node B. Accordingly, during the boosting period as illustrated in FIG. 8, the voltage of the second node B may change by an analog signal input to the selected sampling switch among the sampling switches $S_1$-$S_n$. For example, when the first sampling switch S1 is selected, the voltage of the second node B may change by the first analog signal $VIN_1$. In the description below, the configuration will be described in greater detail with reference to FIG. 9.

Figure 9:
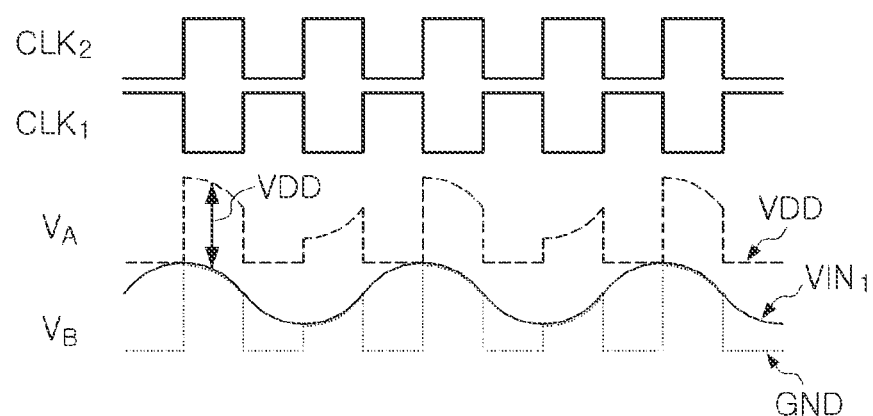
FIG. 9 is a waveform diagram illustrating an operation of a multiplexer according to an example embodiment of the present disclosure.

FIG. 9 is a waveform diagram illustrating an operation of a multiplexer according to an example embodiment.

FIG. 9 illustrates a first clock signal $CLK_1$, a second clock signal $CLK_2$, a voltage $V_A$ of a first node A, a voltage $V_B$ of a second node B, and a first analog signal $VIN_1$. The first clock signal $CLK_1$ may be configured to charge the capacitor $C_B$. For example, the capacitor $C_B$ may be charged while the first clock signal $CLK_1$ has a high logic value and is applied to the charging switches $SC_1$ and $SC_2$ to turn on the switches $SC_1$ and $SC_2$. In other words, the time during which the first clock signal $CLK_1$ has a high logic value may be defined as a pre-charge period.

In an embodiment, the second clock signal $CLK_2$ has a phase opposite to that of the first clock signal $CLK_1$ and is input to the plurality of boosting circuits 510. For example, the second clock signal $CLK_2$ may be used to control the first boosting switch SB1, the second boosting switch SB2, and the third boosting switch SB3 in each of the plurality of boosting circuits 510.

In the example embodiment illustrated in FIG. 9, the first analog signal $VIN_1$ has a magnitude changing over time. During the pre-charge period, the first node A and the second node B are connected to the first power node and the second power node for supplying a predetermined constant voltage, and accordingly, the voltage $V_A$ of the first node A may be maintained at a first power voltage VDD, and the voltage $V_B$ of the second node B may be maintained at a second power voltage GND. The capacitor $C_B$ may be charged by a difference between the first power voltage VDD and the second power voltage GND.

During the boosting period, the first node A and the second node B may be disconnected from the first power node and the second power node. Since the second node B is connected to the node receiving the first analog signal $VIN_1$, the voltage $V_B$ of the second node B may appear as the first analog signal $VIN_1$ in the boosting period as illustrated in FIG. 9. Also, due to a difference in voltages between the first node A and the second node B maintained by the capacitor $C_B$, the voltage $V_A$ of the first node A may appear as a sum of the first power voltage VDD and the first analog signal $VIN_1$ in the boosting period.

Accordingly, in at least a portion of the boosting periods, in an embodiment, the voltage $V_A$ of the first node A is greater than the first power voltage VDD. When the voltage $V_A$ of the first node A is greater than the first power voltage VDD, the first boosting switch SB1 included in the non-selected boosting circuits is not turned off. For example, referring back to FIG. 8, a source of the first boosting switch $SB1_n$ of the n-th boosting circuit $510_n$ (e.g., one of the non-selected boosting circuits) is connected to the first node A, and accordingly, a source voltage of the boosting switch $SB1_n$ is greater than the first power voltage VDD during the boosting period. The first boosting switch $SB1_n$ may be implemented as a PMOS transistor, and accordingly, to turn off the first boosting switch $SB1_n$, a voltage equal to or greater than the sum of the first power voltage VDD and the first analog input signals $VIN_1$ is input to the gate of the first boosting switch $SB1_n$. For example, a voltage equal to or greater than the sum of the first power voltage VDD and the first analog input signals $VIN_1$ may be input to the gate of the PMOS transistor.

The voltage range available in the multiplexer 500 may be determined by the first power voltage VDD and the second power voltage GND. It may be difficult to input a voltage equal to or greater than the sum of the first power voltage VDD and the first analog input signal $VIN_1$ to the gate of the first boosting switch $SB1_n$. Accordingly, in an embodiment, the first boosting switch $SB1_n$ is not completely turned off in the n-th boosting circuit $510_n$ (e.g., a non-selected boosting circuit), and the n-th sampling switch Sn is also not completely turned off.

In an example embodiment, a level shifter which generates a voltage greater than the first power voltage VDD is included in each of the plurality of boosting circuits 510. By controlling the switches included in each of the plurality of boosting circuits 510 with the voltage output by the level shifter, reliability of the multiplexer 500 may improve. In other words, each of the plurality of boosting circuits 510 may include a voltage generator circuit for generating a voltage greater than the first power voltage VDD, and the voltage generation circuit is not limited to a level shifter.

Figure 10:
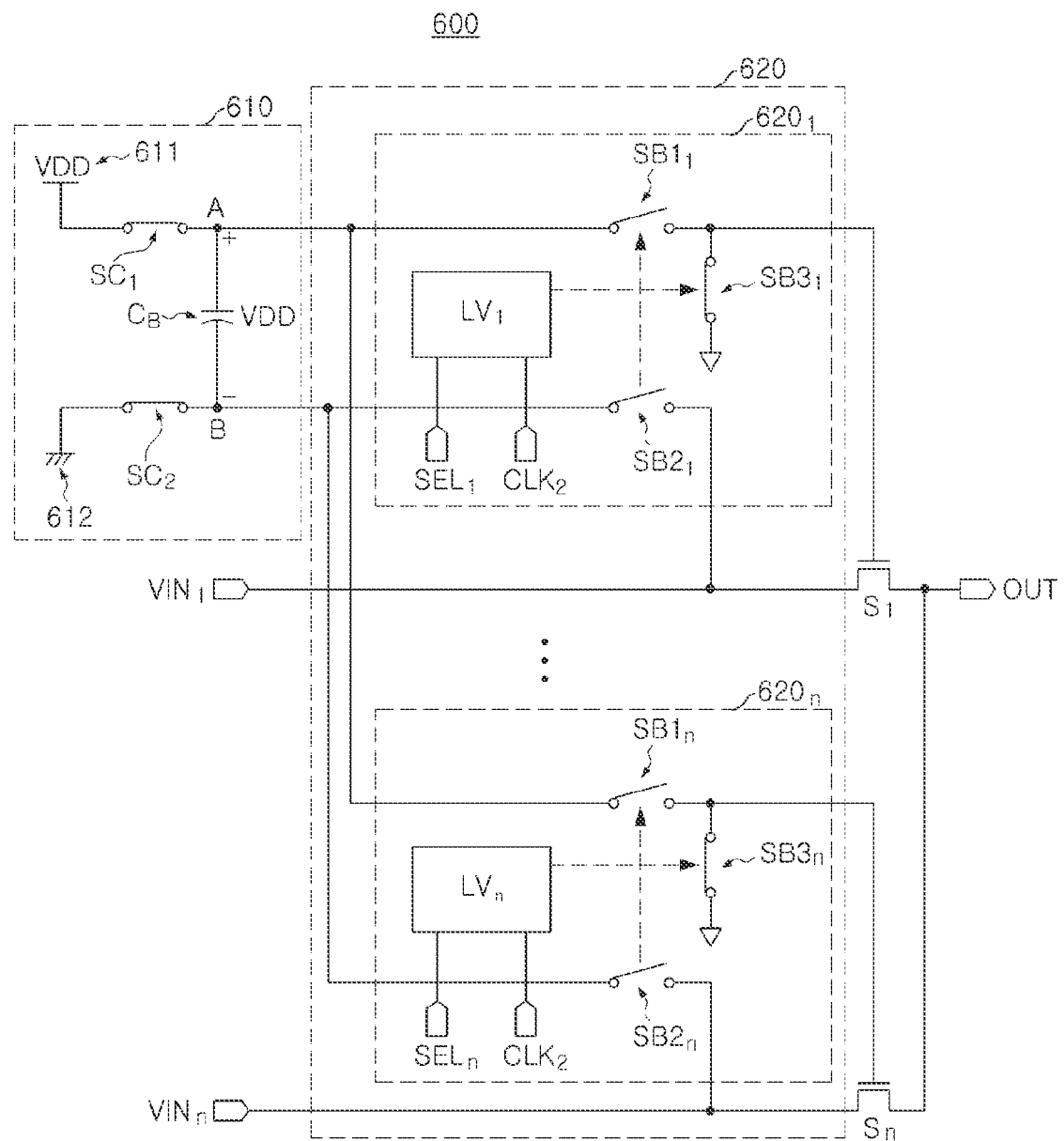
FIGS. 10 and 11 are circuit diagrams illustrating a multiplexer according to an example embodiment of the present disclosure.
Figure 11:
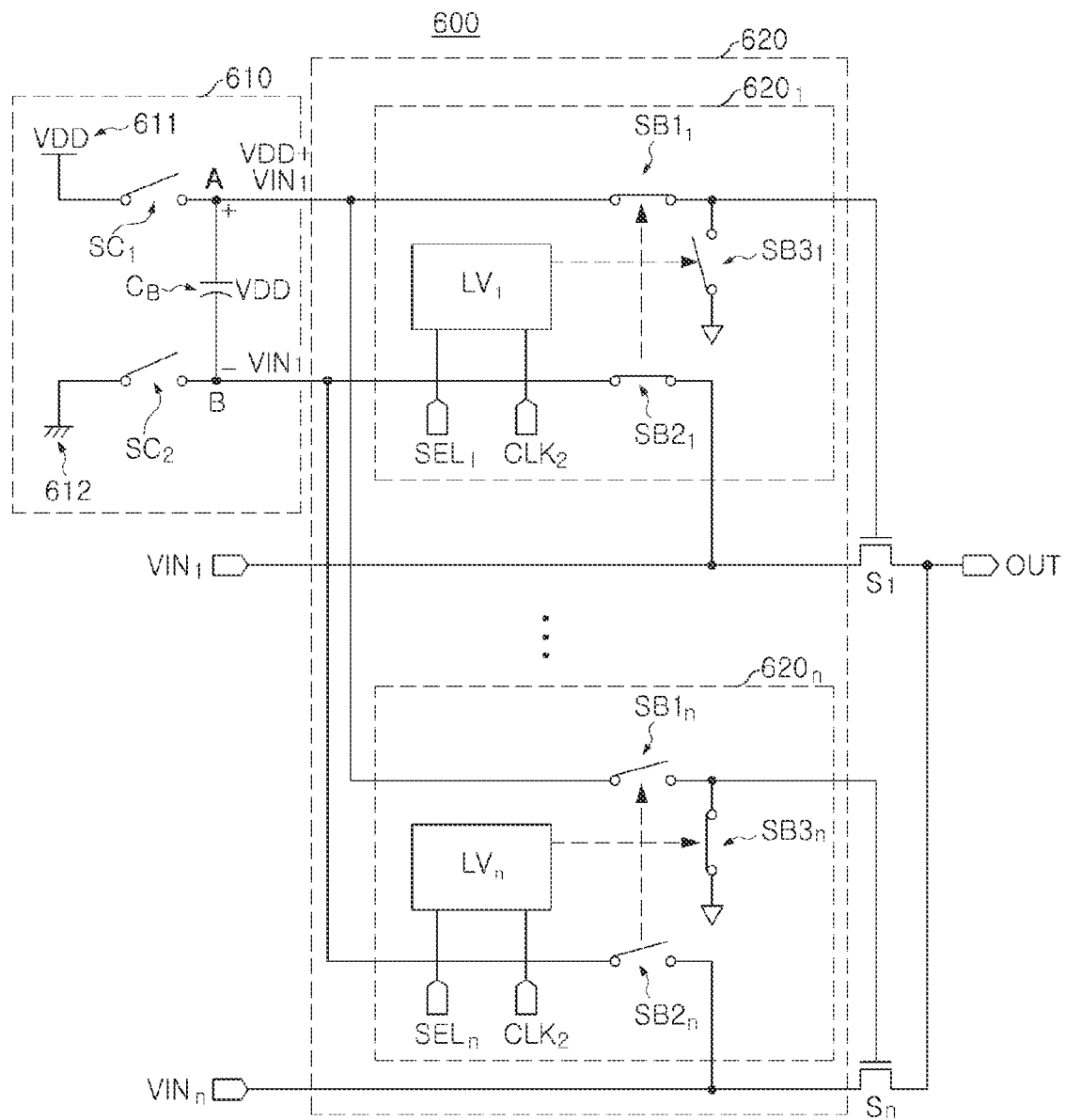

FIGS. 10 and 11 are circuit diagrams illustrating a multiplexer according to an example embodiment.

Referring to FIGS. 10 and 11, the multiplexer 600 in an example embodiment includes a charging circuit 610 and a plurality of boosting circuits $620_1$-$620_n$ (620), and a plurality of sampling switches $S_1$-$S_n$. The plurality of boosting circuits 620 share a single charging circuit 610. The charging circuit 610 includes a capacitor $C_B$, a first charging switch $SC_1$, and a second charging switch $SC_2$. The first charging switch $SC_1$ is connected between a first node A and the first power node 611, and the first charging switch $SC_2$ is connected between a second node B and the second power node 612. The multiplexers 30, 110, 210, 310, 410, or 500 may be implemented by multiplexer 600.

Each of the plurality of boosting circuits 620 includes a first boosting switch SB1, a second boosting switch SB2, and a third boosting switch SB3. In the example embodiment illustrated in FIGS. 10 and 11, each of the plurality of boosting circuits 620 includes a level shifter LV. The level shifter LV may be controlled by one of selection signals $SEL_1$-$SEL_n$ and a second clock signal $CLK_2$. In an embodiment, the second clock signal $CLK_2$ has a phase opposite to that of the first clock signal $CLK_1$ controlling the first charging switch $SC_1$ and the second charging switch $SC_2$, as described with reference to FIG. 9.

In the description below, operation of the multiplexer 600 will be described with reference to FIG. 9 for ease of description.

FIG. 10 is a diagram illustrating an operation in a pre-charge period during which a capacitor $C_B$ is charged by a first power voltage VDD and a second power voltage GND. Referring to FIGS. 9 and 10, during the pre-charge period, the first clock signal $CLK_1$ has a high logic value, and a first charging switch $SC_1$ and a second charging switch $SC_2$ are turned on (e.g., closed) so that the capacitor $C_B$ is charged. For example, the first charging switch $SC_1$ and a second charging switch $SC_2$ may be turned on by the first clock signal $CLK_1$.

During the pre-charge period, the second clock signal $CLK_2$ has a low logic value, and the level shifter LV outputs control voltages for turning off the first boosting switch SB1 and the second boosting switch SB2 and turning on the third boosting switch SB3. For example, the dotted arrows output from the level shifter LV in FIG. 10 represents the control voltages. In an example embodiment, the level shifter LV includes a NAND gate receiving one of the selection signals $SEL_1$-$SEL_n$ and the second clock signal $CLK_2$, and operates in response to a NAND signal output by the NAND gate. For example, a first input of the NAND gate may receive one of the selection signals and a second other input of the NAND gate may receive the second clock signal CLK2. In the pre-charge period, the second clock signal $CLK_2$ has a low logic value and the NAND signal has a high logic value. In other words, the level shifter LV may turn off the first boosting switch SB1 and the second boosting switch SB2 and may turn on the third boosting switch SB3 under the condition in which the NAND signal is a high logic value.

FIG. 11 illustrates an operation in the boosting period in which the capacitor $C_B$ is charged by the first power voltage VDD and the second power voltage GND, and one of the plurality of analog signals $VIN_1$-$VIN_n$ are output to an output terminal OUT. Referring to FIGS. 9 and 11, during the boosting period, the first clock signal $CLK_1$ has a low logic value, the first charging switch $SC_1$ and the second charging switch $SC_2$ are turned off, and the capacitor $C_B$ is disconnected from the first power node 611 and the second power node 612.

During the boosting period, in an embodiment, one of the plurality of selection signals $SEL_1$-$SEL_n$ has a value different from those of the other selection signals. As an example, when the first analog signal $VIN_1$ is to be output to the output terminal OUT during the boosting period, only the first selection signal $SEL_1$ among the plurality of selection signals $SEL_1$-$SEL_n$ has a high logic value and the other selection signals having the low logic value.

Also, as illustrated in FIG. 9, in the boosting period, the second clock signal $CLK_2$ has a high logic value. Accordingly, a NAND signal of a NAND gate receiving the first selection signal $SEL_1$ and the second clock signal $CLK_2$ from the level shifter LV1 included in the first boosting circuit $620_1$ have a low logic value. A NAND gate receiving the n-th selection signal $SEL_n$ and the second clock signal $CLK_2$ from the level shifter $LV_n$ included in a non-selected boosting circuit (e.g., the n-th boosting circuit $620_n$) may output a high logic value.

Accordingly, as illustrated in FIG. 11, in the first boosting circuit $620_1$, the first boosting switch $SB1_1$ and the second boosting switch $SB2_1$ are turned on and the third boosting switch $SB3_1$ is turned off, differently from the pre-charge period. In the n-th boosting circuit $620_n$, each of the first boosting switch $SB1_n$, the second boosting switch $SB2_n$, and the third boosting switch $SB3_n$ may maintain the same state as in the pre-charge period. When the first boosting switch $SB1_1$ is turned on in the first boosting circuit $620_1$, the first sampling switch $S_1$ is turned on, and the first analog signal $VIN_1$ is output to the output terminal OUT.

When the second boosting switch $SB2_1$ is turned on in the first boosting circuit $620_1$, the voltage of the second node B may appear as a first analog signal $VIN_1$. Since the voltage of both ends of the capacitor $C_B$ is maintained as the power voltage VDD charged during the pre-charge period, the voltage of the first node A may appear as a sum of the power voltage VDD and the first analog signal $VIN_1$. Accordingly, in the non-selected boosting circuits, the source voltage of the first boosting switch SB1 may also increase to the sum of the power voltage VDD and the first analog signal $VIN_1$.

In the example embodiment described with reference to FIGS. 10 and 11, the level shifter LV generates a voltage greater than the power voltage (e.g., a control voltage equal to the sum of the power voltage VDD and the first analog signal $VIN_1$), and the control voltage turns off the first boosting switch SB1. Accordingly, the first boosting switch SB1 is not completely turned off and the non-selected sampling switches may be weakly turned on, such that degradation of reliability of the multiplexer 600 may be addressed.

Figure 12:
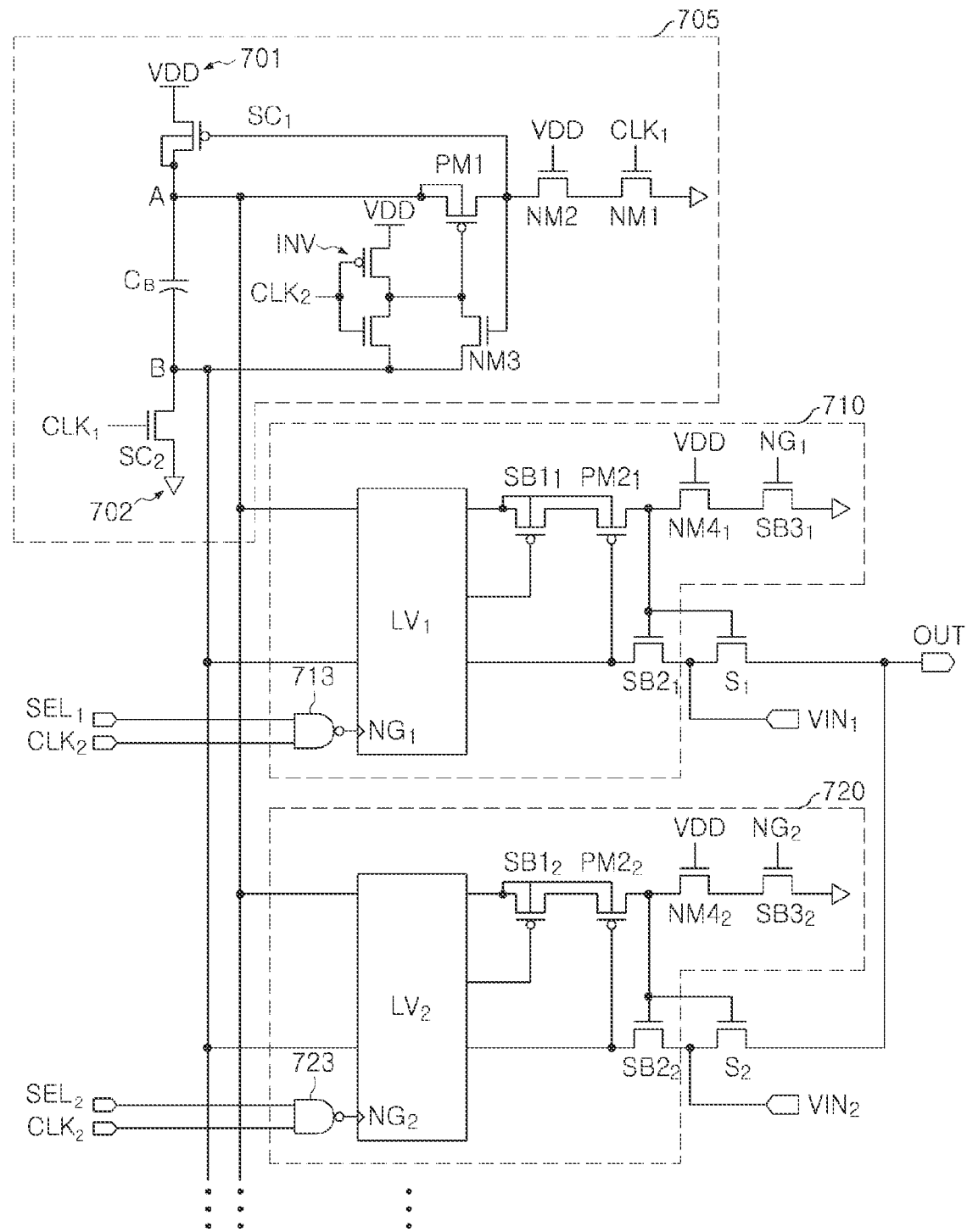
FIGS. 12 and 13 are circuit diagrams illustrating a multiplexer according to an example embodiment of the present disclosure.
Figure 13:
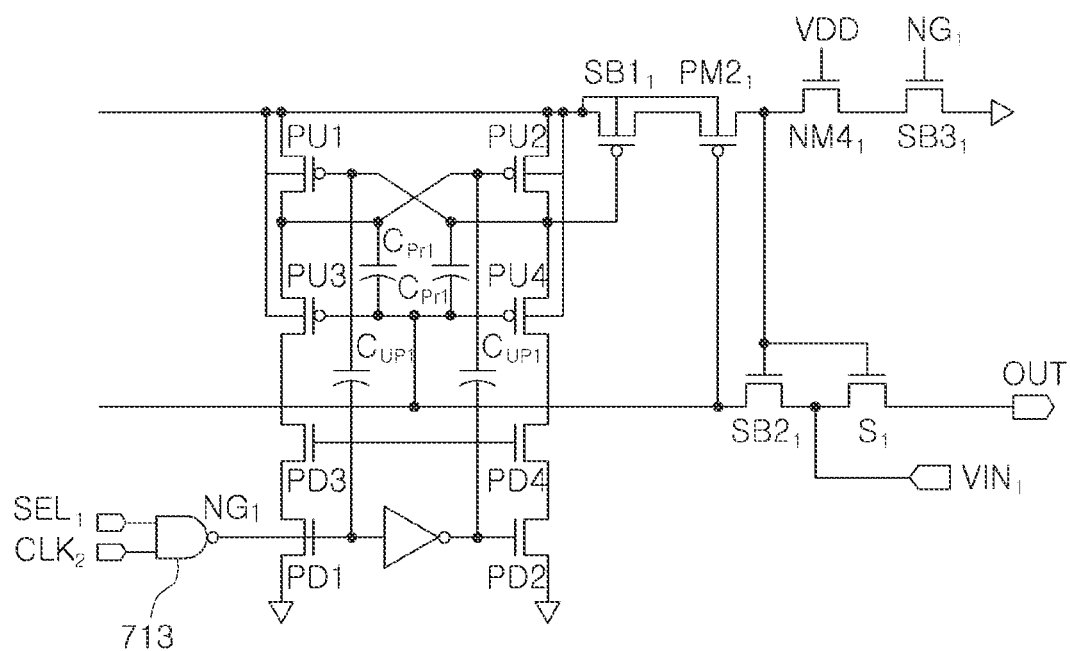

FIGS. 12 and 13 are circuit diagrams illustrating a multiplexer according to an example embodiment.

Referring to FIG. 12, the multiplexer 700 includes a charging circuit 705, a plurality of boosting circuits 710 and 720, and a plurality of sampling switches $S_1$ and $S_2$. In the example embodiment illustrated in FIG. 12, a plurality of boosting circuits 710 and 720 share a single charging circuit 705. The multiplexers 30, 110, 210, 310, 410, 500, or 600 may be implemented by multiplexer 700.

The charging circuit 705 includes a capacitor $C_B$ connected between a first node A and a second node B, a first charging switch $SC_1$ connected between the first power node 701 and the capacitor $C_B$, and a second charging switch $SC_2$ connected between the second power node 702 and the capacitor $C_B$. In an embodiment, the charging circuit 705 includes an inverter INV (e.g., a logic gate or inverter circuit) and a plurality of switch devices PM1 and NM1-NM3. The first charging switch $SC_1$ may be implemented as a PMOS transistor, and the second charging switch $SC_2$ may be implemented as an NMOS transistor.

The charging circuit 705 may operate by a first clock signal $CLK_1$ and a second clock signal $CLK_2$ having opposite phases. For example, in the pre-charge period, since the first clock signal $CLK_1$ has a high logic value, the second charging switch $SC_2$ is turned on. Also, the first and second NMOS switch devices NM1 and NM2 may be turned on, and the first charging switch $SC_1$ may be turned on and the capacitor $C_B$ may be charged to the power voltage VDD. Since the second clock signal $CLK_2$ has a low logic value, the PMOS transistor of the inverter INV is turned on, and the first PMOS switch device PM1 is turned off. In the boosting period after the pre-charge period, the capacitor $C_B$ is disconnected from the first power node 701 and the second power node 702 by operating in a manner opposite to the above example.

Each of the plurality of boosting circuits 710 and 720 includes a level shifter LV, a NAND gate, and a plurality of switch devices. For example, the first boosting circuit 710 includes a first level shifter $LV_1$, a first NAND gate 713, a first boosting switch $SB1_1$, a second boosting switch $SB2_1$, a third boosting switch $SB3_1$, and switch devices $NM4_1$ and $PM2_1$.

In the pre-charge period, the first boosting switch SB1 included in each of the plurality of boosting circuits 710 and 720 is turned off by the level shifter LV, and the third boosting switch SB3 is turned on by a NAND signal NG output by the NAND gate. The second boosting switch SB2 and the sampling switches $S_1$ and $S_2$ are turned off by the third boosting switch SB3 and the NMOS switch device NM4. In the boosting period, operation of the selected boosting circuit may be different from operation of the non-selected boosting circuit among the plurality of boosting circuits 710 and 720, and one of the plurality of analog signals $VIN_1$ and $VIN_2$ may be output to the output terminal OUT.

FIG. 13 is a circuit diagram illustrating the first boosting circuit 710 in the example embodiment illustrated in FIG. 12 in greater detail. The detailed structure of the second boosting circuit 720 may be understood with reference to the first boosting circuit 710.

Referring to FIG. 13, a first level shifter LV1 includes a plurality of pull-up devices PU1-PU4 (e.g., pull-up transistors), a plurality of pull-down devices PD1-PD4 (e.g., pull-down transistors), and a plurality of capacitors $C_{PR1}$ and $C_{UP1}$. Among the plurality of pull-up devices PU1-PU4, the first and second pull-up devices PU1 and PU2 may be connected to the first node A, and gates of the third and fourth pull-up devices PU3 and PU4 may be connected to the second node B. A first capacitor $C_{UP1}$ may be connected between the first pull-up device PU1 and the first pull-down device PD1 and between the second pull-up device PU2 and the second pull-down device PD2. An operation speed of the first level shifter LV1 may improve due to the first capacitor $C_{UP1}$.

The second capacitor $C_{Pr1}$ may be connected between the first pull-up device PU1 and the fourth pull-up device PU4 and between the second pull-up device PU2 and the third pull-up device PU3. Reliability of the pull-up devices PU1-PU4 may be secured using the second capacitor $C_{Pr1}$. In an example embodiment, a capacitance of the second capacitor $C_{Pr1}$ is greater than a capacitance of the first capacitor $C_{UP1}$.

The first NAND signal $NG_1$ generated by the first NAND gate 713 using the first selection signal $SEL_1$ and the second clock signal $CLK_2$ may be input to the first and second pull-down devices PD1 and PD2. For example, the first NAND signal $NG_1$ may be directly input to a gate of the first pull-down device PD1, and an inverted signal of the first NAND signal $NG_1$ may be input to a gate of the second pull-down device PD2.

Although a level shifter is included in each of the boosting circuits, and each of the level shifters includes the first capacitor and the second capacitor, the multiplexer in an example embodiment may be implemented in a relatively small area. For example, when it is assumed that a multiplexer which may select one of 16 analog signals and may transfer the signal to an analog-to-digital converter is included, the multiplexer may include 16 sampling switches. When the multiplexer is implemented according to the comparative example described with reference to FIG. 4, each of the 16 bootstrap circuits need to include a capacitor charged with a power voltage. When it is assumed that the capacitor has a capacitance of 1 pF, the multiplexer may include capacitors having a total capacitance of 16 pF.

When the bootstrap circuit is divided into a charging circuit and a boosting circuit as in an example embodiment, and a plurality of boosting circuits share a single charging circuit, a multiplexer may be implemented with capacitors having a relatively small capacitance. For example, the sum of capacitances of the first capacitor and the second capacitor included in the level shifter of each of the boosting circuits may be about 0.1 pF, which may be sufficient. Therefore, even when the capacitance of the capacitor included in a single charging circuit is increased to more than 1 pF, and the first capacitor and the second capacitor included in the level shifter are considered, a multiplexer may be implemented with capacitors having a relatively small capacitance, and integration density of the semiconductor device may improve.

Figure 14:
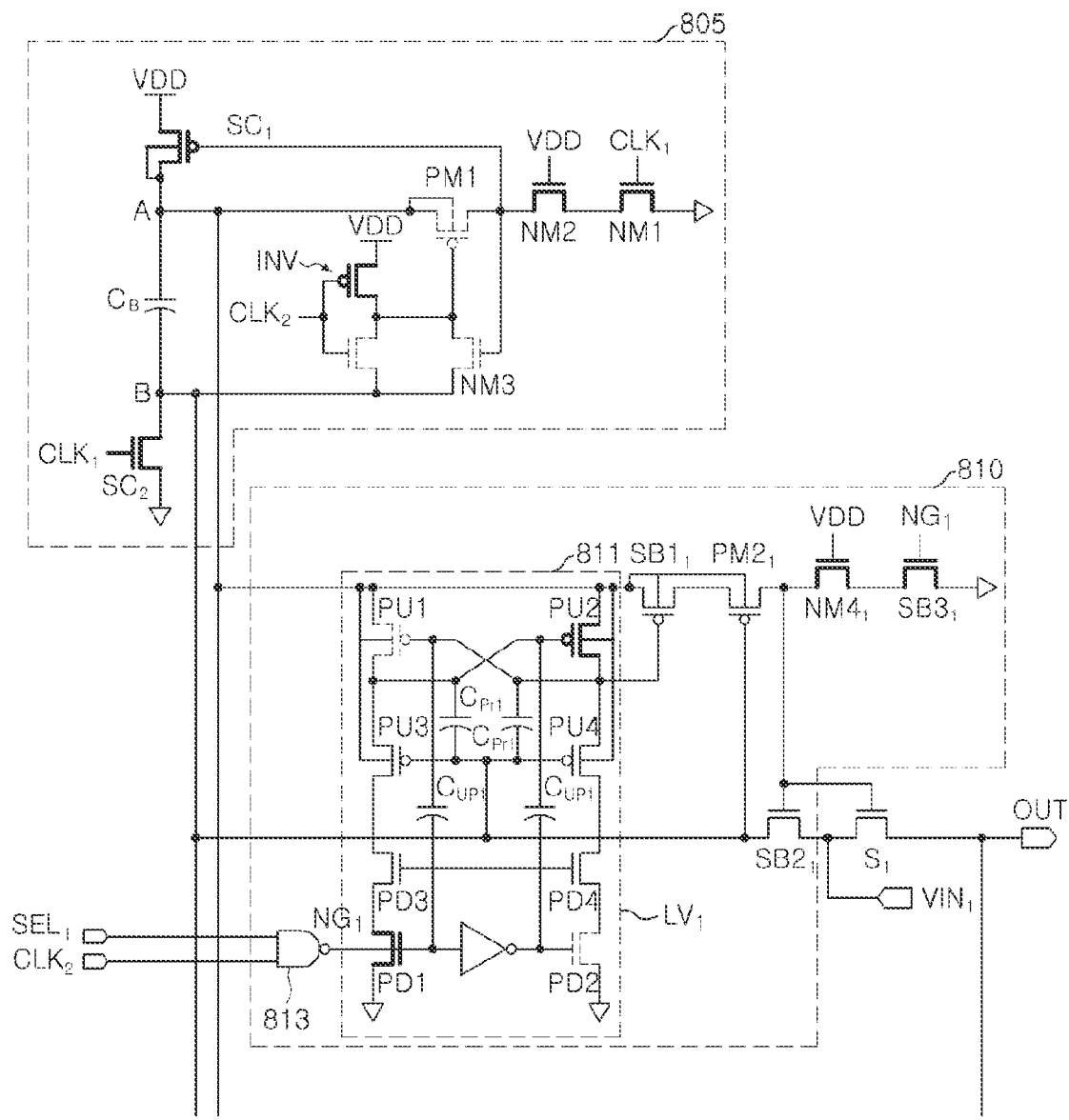
FIGS. 14 to 16 are diagrams illustrating an operation of a multiplexer according to an example embodiment of the present disclosure.
Figure 15:
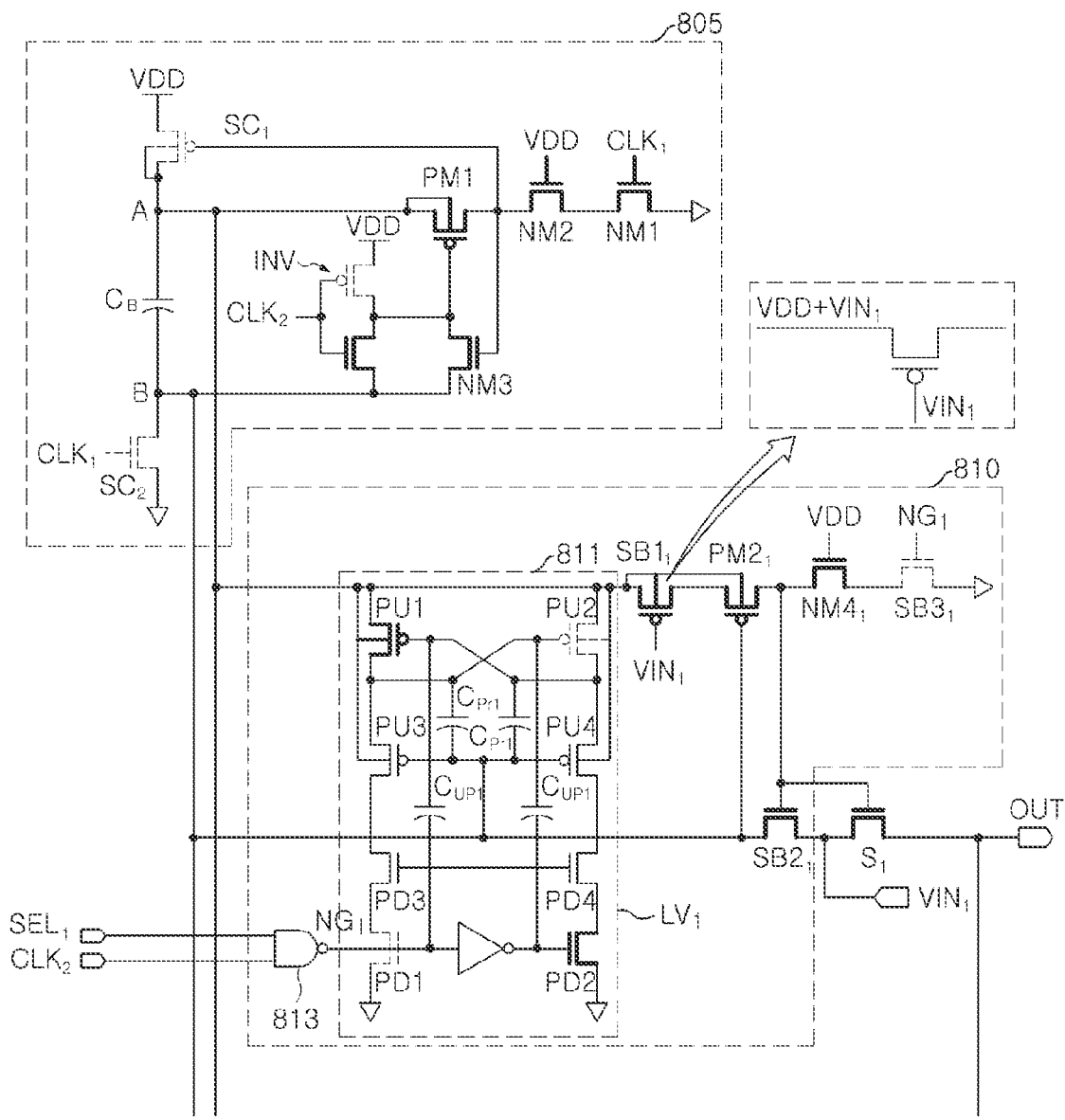
Figure 16:
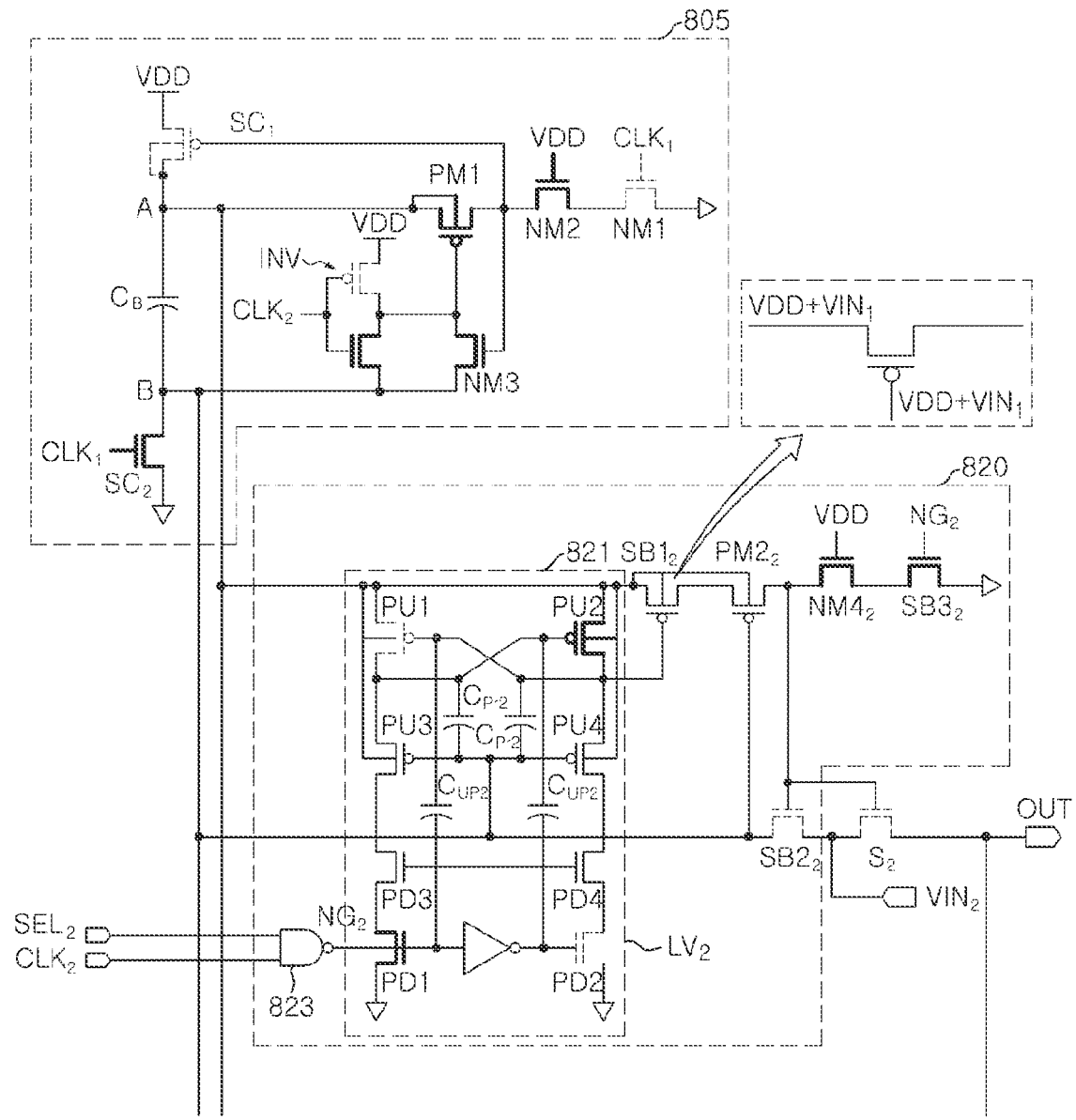

FIGS. 14 to 16 are diagrams illustrating an operation of a multiplexer according to an example embodiment.

FIG. 14 is a diagram illustrating operation of a multiplexer during a pre-charge period. Referring to FIG. 14, the multiplexer includes a charging circuit 805 and a first boosting circuit 810. Although only a single first boosting circuit 810 is illustrated in FIG. 14, the charging circuit 805 in the multiplexer may be connected to two or more boosting circuits. Operations of the boosting circuits in the pre-charge period may be the same, and the configuration will be described with reference to the first boosting circuit 810 in FIG. 14. Each configuration of the charging circuit 805 and the first boosting circuit 810 may be similar to the aforementioned example embodiments described with reference to FIGS. 12 and 13. The multiplexers 30, 110, 210, 310, 410, 500, 600, or 700 may be implemented by the multiplexer of FIG. 14.

In the pre-charge period, the first clock signal $CLK_1$ has a high logic value, and the second clock signal $CLK_2$ has a low logic value. As described in the aforementioned example embodiment with reference to FIG. 12, in the charging circuit 805, the first charging switch $SC_1$ and the second charging switch $SC_2$ are turned on and the capacitor $C_B$ is charged. Also, the first node A may be determined to be the first power voltage VDD, and the second node B may be determined to be the second power voltage GND.

In the pre-charge period, the second clock signal $CLK_2$ has a low logic value, and the first NAND signal $NG_1$ output by the first NAND gate 813 has a high logic value. In the first level shifter $LV_1$, the first pull-down device PD1 and the second pull-up device PU2 are turned on, and the second pull-down device PD2 and the first pull-up device PU1 are turned off. Since the first power voltage VDD is input to the gate of the first pull-up device PU1, the first boosting switch $SB1_1$ is turned off. The first power voltage VDD input to the gate of the first boosting switch $SB1_1$ during the pre-charge period may be defined as a first turn-off voltage. Also, the third boosting switch $SB3_1$ may be turned on by the first NAND signal $NG_1$, and the second boosting switch $SB2_1$ and the first sampling switch $S_i$ may be turned off.

FIG. 15 is a diagram illustrating operation of the selected boosting circuit selected in the boosting period, and FIG. 16 is a diagram illustrating operation of the non-selected boosting circuit not selected in the boosting period. Referring to FIG. 15, a first boosting circuit 810 connected to the charging circuit 805 is selected in the boosting period. Accordingly, as illustrated in FIG. 16, boosting circuits other than the first boosting circuit 810 (e.g., the second boosting circuit 820) are not selected.

Whether to select the boosting circuits 810 and 820 may be determined by the selection signals $SEL_1$ and SEL2 and the second clock signal $CLK_2$. As an example, the second clock signal $CLK_2$ input to the first boosting circuit 810 and the second boosting circuit 820 in common may have a high logic value. Also, the first selection signal $SEL_1$ input to the first boosting circuit 810 may have a high logic value, and the second selection signal $SEL_2$ input to the second boosting circuit 820 may have a low logic value. Accordingly, the first NAND signal $NG_1$ may have a low logic value, whereas the second NAND signal $NG_2$ may have a high logic value.

Referring to FIG. 15, the first pull-down device PD1 may be turned off and the second pull-down device PD2 may be turned on by the first NAND signal $NG_1$. Also, the first pull-up device PU1 may be turned on and the second pull-up device PU2 may be turned off. In this case, a gate voltage of each of the first pull-up device PU1 and the second pull-up device PU2 may increase and decrease rapidly by the first capacitor $C_{UP1}$.

During the boosting period, in the charging circuit 805, the first charging switch $SC_1$ and the second charging switch $SC_2$ may be turned off, and a voltage of the second node B may be determined as the first analog input signal $VIN_1$. A voltage of the first node A may appear as a sum of the power voltage VDD charged in the capacitor $C_B$ during the pre-charge period and the first analog input signal $VIN_1$.

Referring to FIG. 15, the second node B may be connected to an output terminal of the first level shifter $LV_1$ through the second capacitor $C_{Pr1}$. Accordingly, an output voltage of the first level shifter $LV_1$, a voltage input to a gate of the first boosting switch $SB1_1$, may follow the first analog input signal $VIN_1$ input to the second node B. A source of the first boosting switch $SB1_1$ may be connected to the first node A and may receive a sum of the power voltage VDD and the first analog input signal $VIN_1$. Since the first analog input signal $VIN_1$ may be input to a gate of the first boosting switch $SB1_1$ as a turn-on voltage, the first boosting switch $SB1_1$ may be turned on. Also, since the PMOS switch device $PM2_1$ is turned on, the second boosting switch $SB2_1$ and the first sampling switch $S_1$ are turned on, so that the first analog input signal $VIN_1$ is output to an output terminal OUT of the multiplexer.

Referring to FIG. 16, the first pull-down device PD1 may be turned on and the second pull-down device PD2 may be turned off by the second NAND signal $NG_1$. Also, the first pull-up device PU1 may be turned off, and the second pull-up device PU2 may be turned on. Differently from the aforementioned example embodiment described with reference to FIG. 15, the turned on/off state of the pull-up devices PU1-PU4 and the pull-down devices PD1-PD4 in the level shifter $LV_2$ of the second boosting circuit 820 during the boosting period may be maintained to be in the same state as in the pre-charge period.

As described above, a voltage of the first node A during the boosting period may appear as a sum of the power voltage VDD charged in the capacitor $C_B$ during the pre-charge period and the first analog input signal $VIN_1$. The voltage of the second node B may be determined as the first analog input signal $VIN_1$.

In the second boosting circuit 820, a source voltage of the first boosting switch $SB1_2$ may be determined as a sum of the power voltage VDD and the first analog input signal $VIN_1$. Accordingly, even when the first power voltage VDD (e.g., a maximum voltage received by the multiplexer 800) is input to a gate of the first boosting switch $SB1_2$, the first boosting switch $SB1_2$ is not completely turned off.

In the example embodiment illustrated in FIG. 16, since the first analog input signal $VIN_1$ is input through the second node B, an output voltage of the second level shifter $LV_2$ may be determined as a sum of the power voltage VDD and the first analog input signals $VIN_1$. Accordingly, a voltage greater than the first power voltage VDD may be input to a gate of the first boosting switch $SB1_2$, and the first boosting switch $SB1_2$ may be effectively turned on by the second boosting circuit 820 (e.g., a non-selected boosting circuit). The third boosting switch $SB3_2$ of the second boosting circuit 820 may be turned on by the second NAND signal $NG_2$. Accordingly, the second boosting switch $SB2_2$ and the second sampling switch S2 may be turned off.

During the boosting period, a voltage input to the gate of the first boosting switch $SB1_1$ of the second boosting circuit 820 (e.g., a non-selected boosting circuit) may be defined as a second turn-off voltage. In an embodiment, the second turn-off voltage is different from the first turn-off voltage described with reference to FIG. 14 and is greater than the first turn-off voltage. For example, the second turn-off voltage may be greater than the first turn-off voltage by the first analog signal $VIN_1$. Also, the second turn-off voltage may be greater than the voltage charged in the capacitor $C_B$ during the pre-charge period.

In the example embodiment illustrated in FIG. 16, the output voltage of the second level shifter $LV_2$ (e.g., the output voltage of the second pull-up device PU2) may increase to a sum of the power voltage VDD and the first analog input signal $VIN_1$. In an example embodiment, a maximum value of the analog input signals including the first analog input signal $VIN_1$ is the power voltage VDD. In this case, the output voltage of the second pull-up device PU2 may increase to twice the power voltage VDD in the boosting period. Accordingly, when the gate voltage of the second pull-up device PU2 is maintained at the second power voltage GND as in the boosting period, a voltage equal to or higher than the threshold voltage may be input to the second pull-up device PU2, such that a reliability issue may occur.

In an example embodiment, the above issue may be addressed using the second capacitor $C_{Pr1}$. Referring to FIG. 16, the second capacitor $C_{Pr1}$ may be connected between the second node B2 and the gate of the second pull-up device PU2. Therefore, during the boosting period, the gate voltage of the second pull-up device PU2 is not maintained to be the second power voltage GND through the second capacitor $C_{Pr1}$, may follow the first analog input signal $VIN_1$, and the reliability issue of the second pull-up device PU2 may be prevented.

Figure 17:
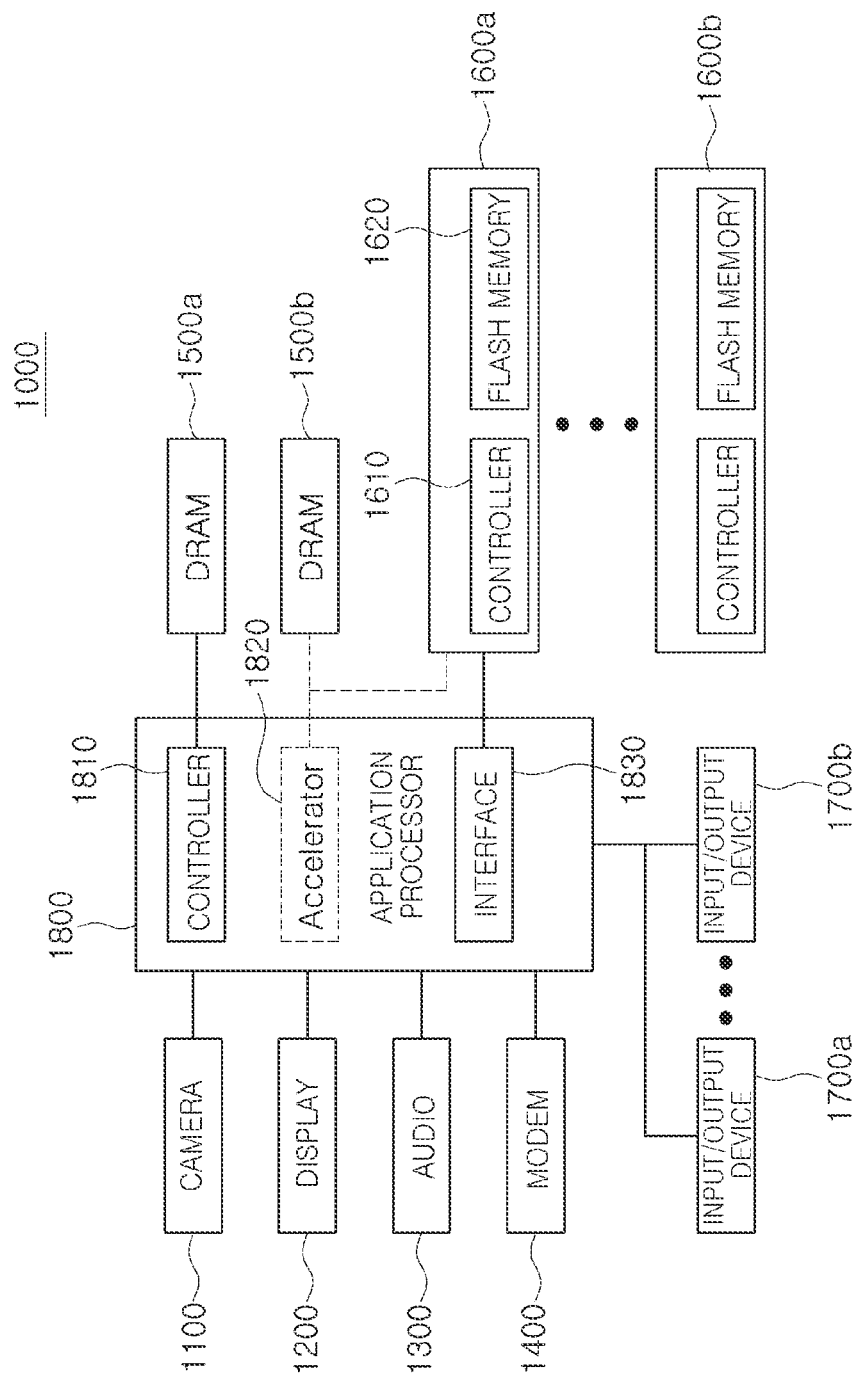
FIG. 17 is a block diagram illustrating an electronic device including a multiplexer according to an example embodiment of the present disclosure.

FIG. 17 is a block diagram illustrating an electronic device including a multiplexer according to an example embodiment.

Referring to FIG. 17, the mobile system 1000 includes a camera 1100, a display 1200, an audio processing unit 1300, a modem 1400, DRAMs 1500a and 1500b, flash memory devices 1600a and 1600b, I/O devices 1700a and 1700b, and an application processor (hereinafter, "AP") 1800.

The mobile system 1000 may be implemented as a laptop computer, a portable terminal, a smartphone, a tablet PC, a wearable device, a healthcare device, or an Internet-of-Things (IoT) device. Also, the mobile system 1000 may be implemented as a server or a personal computer.

The camera 1100 may obtain a still image or a video (e.g., a moving image) according to a user's control. The mobile system 1000 may obtain specific information using a still image/video obtained by the camera 1100 or may convert the still image/video into other types of data, such as text, and may store the data. Alternatively, the mobile system 1000 may recognize a character string included in a still image/video obtained by the camera 1100 and may provide a text or audio translation corresponding to the character string. As described above, the fields of application of the camera 1100 in the mobile system 1000 are diverse. In an example embodiment, the camera 1100 may transmit data such as still image/video to the AP 1800 according to a D-Phy or C-Phy interface according to a MIPI standard.

The display 1200 may be implemented by a liquid crystal display (LCD), an organic light emitting diodes (OLED) display, an active-matrix organic light-emitting diode (AM-OLED), a plasma display panel (PDP), a field emission display FED, or electronic paper. In an example embodiment, the display 1200 may be used as an input device of the mobile system 1000 by providing a touchscreen function. Also, the display 1200 may be integrated with a fingerprint sensor to provide a security function of the mobile system 1000. In an example embodiment, the AP 1800 may transmit image data to be displayed on the display 1200 to the display 1200 depending on a D-Phy or C-Phy interface according to the MIPI standard.

The interface device described in the example embodiments may be applied communication between the AP 1800 and the display 1200 and communication between the AP 1800 and the camera 1100. At least one of the AP 1800, the display 1200, and the camera 1100 may appropriately select a control signal for charging and discharging a capacitor included in the interface device, such that a slew rate of the output signal output by the interface device may increase or decrease.

As an example, by increasing the slew rate of the output signal output by the interface device, a speed of data transmission between the AP 1800 and the display 1200 and/or between the AP 1800 and the camera 1100 may increase, and noise properties may be addressed. Also, by increasing the slew rate of the output signal output by the interface device, an effect of communication between the AP 1800 and the display 1200 and/or communication between the AP 1800 and the camera 1100 on the other components may be reduced, and power consumption may be reduced.

The audio processing unit 1300 may process audio data stored in the flash memory devices 1600a and 1600b or audio data included in content received from an external entity through the I/O devices 1700a and 1700b. For example, the audio processing unit 1300 may perform various processing operations such as coding/decoding, amplification, and noise filtering, for audio data.

The modem 1400 may modulate and transmit a signal for transmission and reception of wired/wireless data, and may recover an original signal by demodulating a signal received from an external entity. The I/O devices 1700a and 1700b may provide digital input/output, and may include a port connectable to an external recording medium, an input device such as a touchscreen or a mechanical button key, and an output device which may output vibrations by a haptic method. In example embodiments, the I/O devices 1700a and 1700b may be connected to an external recording medium through ports such as USB, a lightning cable, an SD card, a micro SD card, a DVD, or a network adapter.

The AP 1800 may control overall operations of the mobile system 1000. For example, the AP 1800 may control the display 1200 such that a portion of content stored in the flash memory devices 1600a and 1600b may be displayed on the screen. Also, when a user input is received through the I/O devices 1700a and 1700b, the AP 1800 may perform a control operation corresponding to the user input.

The AP 1800 may be provided as a system-on-chip ("SoC") for driving an application program or an operating system (OS). Also, the AP 1800 may be included in a single semiconductor package along with other devices included in the mobile system 1000, such as the DRAM 1500*a*, the flash memory 1620 and/or the memory controller 1610, for example. For example, at least one device different from the AP 1800 may be provided in the form of a package such as package on package (PoP), ball grid arrays (BGAs), chip scale packages (CSPs), system in package (SIP), multi-chip package (MCP), wafer-level fabricated package (WFP), or wafer-level processed stack package (WSP). A kernel of the operating system driven on the AP 1800 may include an I/O scheduler and a device driver for controlling the flash memory devices 1600*a* and 1600*b*. The device driver may control access performance of the flash memory devices 1600*a* and 1600*b* referring to the number of synchronization queues managed by the I/O scheduler, or may control a CPU mode in the SoC, and a dynamic voltage and frequency scaling (DVFS) level.

In an example embodiment, the AP 1800 may include a processor block for executing a calculation or driving an application program and/or an operating system, and various other peripheral components connected to the processor block through a system bus. The peripheral components may include a memory controller, an internal memory, a power management block, an error detection block, and a monitoring block. The processor block may include one or more cores. When a plurality of cores are included in the processor block, each of the cores may include a cache memory, and a common cache shared by the cores may be included in the processor block.

In an example embodiment, the AP 1800 may include an accelerator block 1820. The accelerator block 1820 may be a dedicated circuit for an artificial intelligence (AI) data operation. Alternatively, in example embodiments, an accelerator chip may be provided separately from the AP 1800, and a DRAM 1500*b* may be additionally connected to the accelerator block 1820 or the accelerator chip. The accelerator block 1820 may be configured as a functional block which may specialize in performing a specific function of the AP 1800, and may include a graphics processing unit (GPU) specializing in processing graphics data, a neural processing unit (NPU) specializing in AI calculation and inference, and a data processing unit (DPU) specializing in data transmission.

According to an example embodiment, the mobile system 1000 may include a plurality of DRAMs 1500*a* and 1500*b*. In an example embodiment, the AP 1800 may include a controller 1810 for controlling the DRAM 1500*a* and 1500*b*, and the DRAM 1500*a* may be directly connected to the AP 1800.

The AP 1800 may control the DRAM by setting a command and a mode register set (MRS) conforming to the JEDEC standard, or may communicate by setting specifications and functions required for the mobile system 1000 such as low voltage/high speed/reliability, and DRAM interface protocol for CRC/ECC. For example, the AP 1800 may communicate with the DRAM 1500*a* through an interface conforming to the JEDEC standard, such as LPDDR4 and LPDDR5. Alternatively, the AP 1800 may set a new DRAM interface protocol to control a DRAM 1500*b* for an accelerator in which an accelerator block 1820 or an accelerator chip provided separately from the AP 1800 may have a bandwidth higher than that of the DRAM 1500*a*.

In FIG. 17, while only the DRAMs 1500*a* and 1500*b* are illustrated, the configuration of the mobile system 1000 is not limited thereto. For example, memories other than the DRAMs 1500*a* and 1500*b* may be included in the mobile system 1000 depending on the bandwidth and reaction speed of the AP 1800 or the accelerator block 1820 and voltage conditions. For example, the controller 1810 and/or the accelerator block 1820 may control various memories such as PRAM, SRAM, MRAM, RRAM, FRAM, and hybrid RAM. The DRAMs 1500*a* and 1500*b* may have relatively lower latency and higher bandwidth than those of the I/O devices 1700*a* and 1700*b* or the flash memory devices 1600*a* and 1600*b*. The DRAMs 1500*a* and 1500*b* may be initialized at the time of powering-on of the mobile system 1000. When the operating system and application data are loaded, the DRAMs 1500*a* and 1500*b* may be used as a temporary storage space for the operating system and application data or as an execution space for various software codes.

In the DRAMs 1500*a* and 1500*b*, arithmetic operations of add/subtract/multiply/divide, a vector operation, an address operation, or an FFT operation data may be stored. In another example embodiment, the DRAMs 1500*a* and 1500*b* may be provided as a processing in memory (PIM) including an arithmetic function. For example, a function for execution used for an inference may be performed in the DRAM 1500*a* and 1500*b*. The inference may be performed in a deep learning algorithm using an artificial neural network. The deep learning algorithm may include a training process of learning a model through various data and an inference process of recognizing data using the trained model. For example, the function used for the inference may include a hyperbolic tangent function, a sigmoid function, or a rectified linear unit (ReLU) function.

In an example embodiment, an image obtained by a user through the camera 1100 may be signal-processed and stored in the DRAM 1500*b*, and the accelerator block 1820 or the accelerator chip may perform an AI data calculation for recognizing data using data stored in the DRAM 1500*b* and a function used for inference.

In example embodiments, the mobile system 1000 may include a plurality of storage devices or a plurality of flash memory devices 1600*a* and 1600*b* having a capacity larger than that of the DRAMs 1500*a* and 1500*b*. The flash memory devices 1600*a* and 1600*b* may include a controller 1610 and a flash memory 1620. The controller 1610 may receive a control command and data from the AP 1800 and may write data in the flash memory 1620 in response to the control command or may read data stored in the flash memory 1620 and may transmit the data to the AP 1800.

In example embodiments, the accelerator block 1820 or the accelerator chip may perform a training process and an AI data calculation using the flash memory devices 1600*a* and 1600*b*. In an example embodiment, a block for performing a predetermined calculation may be implemented in the flash memory devices 1600*a* and 1600*b*, and the block may perform the training operation and at least a portion of the inference AI data calculation, performed by the AP 1800 and/or the accelerator block 1820, using the data stored in the flash memory 1620.

In an example embodiment, the AP 1800 may include an interface 1830, and accordingly, the flash memory devices 1600*a* and 1600*b* may be directly connected to the AP 1800. For example, the AP 1800 may be implemented as an SoC, the flash memory device 1600*a* may be implemented as a chip different from the AP 1800, and the AP 1800 and the flash memory device 1600*a* may be mounted on a single package. However, an example embodiment thereof is not limited thereto, and the plurality of flash memory devices 1600a and 1600b may be electrically connected to the mobile system 1000 through a connection.

The flash memory devices 1600a and 1600b may store data such as still images/videos obtained by the camera 1100, or may store data received through ports included in a communication network and/or I/O devices 1700a and 1700b. For example, the flash memory devices 1600a and 1600b may store augmented reality/virtual reality, high definition (HD) or ultrahigh definition (UHD) content.

According to the aforementioned example embodiments, a charging circuit occupying a relatively large area may be shared by the plurality of boosting circuits. The plurality of boosting circuits may be connected between the plurality of sampling switches and the charging circuit. Each of the boosting circuits may include a circuit for generating a voltage equal to or higher than the power voltage, such that only the boosting circuit of the selected channel turns on the sampling switch and the boosting circuits of the non-selected channels turn off the sampling switches.

While the example embodiments have been illustrated and described above, it will be apparent to those of ordinary skill in the art that modifications and variations could be made without departing from the scope of the present disclosure.

What is claimed is:

1. A multiplexer, comprising:
a charging circuit including a first charging switch connected to a first power node for outputting a first power voltage, a second charging switch connected to a second power node for outputting a second power voltage lower than the first power voltage, and a capacitor connected between a first node connected to the first charging switch and a second node connected to the second charging switch;
a plurality of sampling switches configured to receive a plurality of input signals; and
a plurality of boosting circuits connected between the plurality of sampling switches and the charging circuit and configured to share the charging circuit,
wherein the first charging switch and the second charging switch are controlled by a first clock signal, and
wherein each of the plurality of boosting circuits includes a first boosting switch connected to the first node and a gate of one of the plurality of sampling switches, a second boosting switch connected between the second node and the one of the plurality of sampling switches, and a level shifter configured to control the first boosting switch and the second boosting switch in response to a second clock signal and a selection signal,
wherein the level shifter includes pull-up devices connected to the first power node, pull-down devices connected to the second power node, and capacitors connected between gates of the pull-up devices and gates of the pull-down devices.

2. The multiplexer of claim 1, wherein the first clock signal and the second clock signal have opposite phases.

3. The multiplexer of claim 2, wherein the first boosting switch and the second boosting switch are controlled by the second clock signal.

4. The multiplexer of claim 3, wherein each of the plurality of boosting circuits further includes a third boosting switch connected to a node between the gate of the one of the plurality of sampling switches and the first boosting switch, and controlled by the first clock signal.

5. The multiplexer of claim 1, wherein a terminal for receiving one of the plurality of input signals in each of the plurality of sampling switches is connected to the second boosting switch and the second node.

6. The multiplexer of claim 1, wherein the first boosting switch includes a positive-metal-oxide-semiconductor (PMOS) transistor, and the second boosting switch includes a negative-metal-oxide-semiconductor (NMOS) transistor.

7. The multiplexer of claim 6, wherein each of the plurality of boosting circuits further includes a PMOS switch device connected between the first boosting switch and the second boosting switch.

8. The multiplexer of claim 7, wherein a gate of the first boosting switch is connected to an output node of the level shifter, and a gate of the PMOS switch device is connected to the second power node.

9. The multiplexer of claim 1, wherein the charging circuit includes a first charging circuit connected to a first group of the boosting circuits and a second charging circuit connected to a second group of the boosting circuits different from the first group.

10. A multiplexer, comprising:
a charging circuit including a capacitor charged in response to a first clock signal;
a plurality of sampling switches configured to receive a plurality of input signals; and
a plurality of boosting circuits connected between the plurality of sampling switches and the charging circuit, and configured to share the charging circuit and operate in response to a second clock signal having a phase opposite to the first clock signal, wherein, when a selected sampling switch and non-selected sampling switches are determined among the sampling switches, a selected boosting circuit among the plurality of boosting circuits, connected to the selected sampling switch, is electrically connected to the charging circuit, and non-selected boosting circuits among the plurality of boosting circuits, connected to the non-selected sampling switches are electrically disconnected from the charging circuit,
wherein each of the plurality of boosting circuits is connected to or is disconnected from the charging circuit in response to an output signal of a NAND gate receiving the second clock signal and one of a plurality of selection signals.

11. The multiplexer of claim 10, wherein the plurality of boosting circuits receive the plurality of selection signals for selecting one of the plurality of sampling switches from an external source.

12. The multiplexer of claim 10, wherein, in a pre-charge period in which the first clock signal has a first logic value, the capacitor is charged and the plurality of boosting circuits are disconnected from the charging circuit, and wherein, in a boosting period in which the first clock signal has a second logic value different from the first logic value, the selected boosting circuit is connected to the charging circuit and the non-selected boosting circuits are disconnected from the charging circuit.

13. The multiplexer of claim 12, wherein the capacitor is connected between a first power node and a second power node, and a voltage of the first power node is greater than a voltage of the second power node, and wherein the voltage of the first power node is a first power voltage and the voltage of the second power node is a second power voltage, in the pre-charge period.

14. The multiplexer of claim 13, wherein the voltage of the first power node is a sum of an input voltage input to the selected sampling switch and the first power voltage, and the voltage of the second power node is a sum of the second power voltage and the input voltage, in the boosting period.

15. The multiplexer of claim 14, wherein each of the plurality of boosting circuits includes a first boosting switch connected to the first power node and a gate of one of the plurality of sampling switches, and a second boosting switch connected between the second power node and the one of the plurality of sampling switches, and wherein a voltage corresponding to a sum of the input voltage and the first power voltage is input to a gate of the first boosting switch included in each of the non-selected boosting circuits in the boosting period.

16. A semiconductor device, comprising:
an analog-to-digital converter configured to convert an analog input signal into a digital output signal;
a multiplexer connected to an input terminal of the analog-to-digital converter and configured to select one of a plurality of analog signals as the analog input signal; and
a plurality of analog circuits configured to output the plurality of analog signals, wherein the multiplexer includes a charging circuit including a capacitor, a plurality of sampling switches, and a plurality of boosting circuits connected between the charging circuit and the plurality of sampling switches,
wherein each of the plurality of sampling switches is connected between an output terminal of one of the plurality of analog circuits and an input terminal of the analog-to-digital converter, and
wherein each of the plurality of boosting circuits includes a first boosting switch connected between an upper node of the capacitor and a gate of one of the plurality of sampling switches, a second boosting switch connected between a lower node of the capacitor and a source of the one of the plurality of sampling switches, and a level shifter configured to control the first boosting switch and the second boosting switch,
wherein a first turn-off voltage input to the first boosting switches connected to the plurality of sampling switches in a pre-charge period in which the plurality of sampling switches are turned off is different from a second turn-off voltage input to the first boosting switches connected to non-selected sampling switches in a boosting period in which the plurality of sampling switches are determined as a selected sampling switch and the non-selected sampling switches and the selected sampling switch is turned on.

17. The semiconductor device of claim 16, wherein the first turn-off voltage is smaller than the second turn-off voltage.

* * * * *